(12) United States Patent
Kaga et al.

(10) Patent No.: US 10,366,894 B2
(45) Date of Patent: Jul. 30, 2019

(54) METHOD OF MANUFACTURING SEMICONDUCTOR DEVICE, SUBSTRATE PROCESSING DEVICE, AND RECORDING MEDIUM

(71) Applicant: HITACHI KOKUSAI ELECTRIC INC., Tokyo (JP)

(72) Inventors: Yukinao Kaga, Toyama (JP); Arito Ogawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/067,467

(22) Filed: Mar. 11, 2016

(65) Prior Publication Data

US 2016/0196978 A1 Jul. 7, 2016

Related U.S. Application Data

(63) Continuation of application No. PCT/JP2015/059457, filed on Mar. 26, 2015.

(30) Foreign Application Priority Data

Mar. 28, 2014 (JP) ................................. 2014-069336

(51) Int. Cl.
*H01L 21/28* (2006.01)
*C23C 16/32* (2006.01)
(Continued)

(52) U.S. Cl.
CPC ........ *H01L 21/28088* (2013.01); *C23C 16/32* (2013.01); *C23C 16/455* (2013.01);
(Continued)

(58) Field of Classification Search
CPC . C23C 16/32; C23C 16/455; C23C 16/45531; C23C 16/52; H01L 21/28088; H01L 21/28562; H01L 21/32051
See application file for complete search history.

(56) References Cited

U.S. PATENT DOCUMENTS

2008/0102204 A1* 5/2008 Elers ...................... C23C 16/32
427/249.1
2010/0297846 A1 11/2010 Kaga et al.
(Continued)

FOREIGN PATENT DOCUMENTS

JP 2010-508661 A 3/2010
JP 2011-006783 A 1/2011
(Continued)

OTHER PUBLICATIONS

International Search Report, PCT/JP2015/059457, dated Jun. 23, 2015, 1 pg.
(Continued)

*Primary Examiner* — Matthew L Reames
*Assistant Examiner* — Benjamin Tzu-Hung Liu
(74) *Attorney, Agent, or Firm* — Volpe and Koenig, P.C.

(57) ABSTRACT

A method for manufacturing a semiconductor device, including: forming a metal carbide film including a first metal element and a second metal element on a substrate, by time-divisionally performing, supplying a first precursor gas containing the first metal element and not containing carbon to the substrate, supplying a second precursor gas containing the second metal element differing from the first metal element and not containing carbon to the substrate, and supplying a reaction gas containing carbon to the substrate.

14 Claims, 11 Drawing Sheets

(51) Int. Cl.
 C23C 16/455 (2006.01)
 C23C 16/52 (2006.01)
 H01L 21/285 (2006.01)
 H01L 21/3205 (2006.01)
(52) U.S. Cl.
 CPC ........ *C23C 16/45531* (2013.01); *C23C 16/52* (2013.01); *H01L 21/28562* (2013.01); *H01L 21/32051* (2013.01)

(56) References Cited

U.S. PATENT DOCUMENTS

| | | | | |
|---|---|---|---|---|
| 2011/0147851 | A1* | 6/2011 | Thomas | H01L 21/28088 257/369 |
| 2011/0263115 | A1 | 10/2011 | Ganguli et al. | |
| 2012/0184110 | A1* | 7/2012 | Hirose | C23C 16/30 438/763 |
| 2012/0329286 | A1* | 12/2012 | Takeda | H01L 21/02126 438/781 |
| 2014/0120712 | A1* | 5/2014 | Ganguli | C23C 16/06 438/592 |
| 2014/0273428 | A1* | 9/2014 | Shero | H01L 21/02211 438/592 |
| 2014/0273510 | A1* | 9/2014 | Chen | H01L 21/02337 438/763 |

FOREIGN PATENT DOCUMENTS

| | | |
|---|---|---|
| JP | 2012119432 A | 6/2012 |
| KR | 1020090085654 | 8/2009 |
| KR | 1020130062935 | 6/2013 |

OTHER PUBLICATIONS

Japanese Office Action for Japanese Patent Application No. 2016-510500 (with English Translation).
Office Action for Korean Patent Application No. 10-2016-7006376.

* cited by examiner

METHOD OF MANUFACTURING SEMICONDUCTOR DEVICE, SUBSTRATE PROCESSING DEVICE, AND RECORDING MEDIUM

CROSS-REFERENCE TO RELATED APPLICATIONS

This application is a Continuation Application of PCT International Application No. PCT/JP2015/059457, filed on Mar. 26, 2015, which claimed the benefit of Japanese Patent Application No. 2014-069336, filed on Mar. 28, 2014, the disclosure of which is incorporated herein in its entirety by reference.

TECHNICAL FIELD

The present disclosure relates to a method for manufacturing a semiconductor device, a substrate processing device and a recording medium.

BACKGROUND

In a semiconductor device including a transistor such as a MOSFET (Metal-Oxide-Semiconductor Field Effect Transistor) or the like, various kinds of metal films have been used as electrodes or wiring lines along with the high integration and the high performance thereof. Among them, as gate electrodes or capacitor electrodes of a DRAM (Dynamic Random Access Memory), metal-carbide-based metal films are often used from the viewpoint of oxidation resistance, electrical resistivity, work function, and so forth.

As an important parameter indicating the characteristics of a MOSFET, there is a threshold voltage (Vth). The threshold voltage is determined by a work function of an electrode. In recent years, an electrode that includes a metal film capable of adjusting a work function to different values depending on the intended use is often required.

It is an object of the present disclosure to provide a technique capable of adjusting a work function of a metal film.

SUMMARY

According to one aspect of the present disclosure, there is provided a technique, including:

forming a metal carbide film including a first metal element and a second metal element on a substrate, by time-divisionally performing supplying a first precursor gas containing the first metal element and not containing carbon to the substrate, supplying a second precursor gas containing the second metal element differing from the first metal element and not containing carbon to the substrate, and supplying a reaction gas containing carbon to the substrate.

DETAILED DESCRIPTION

Figure 1:
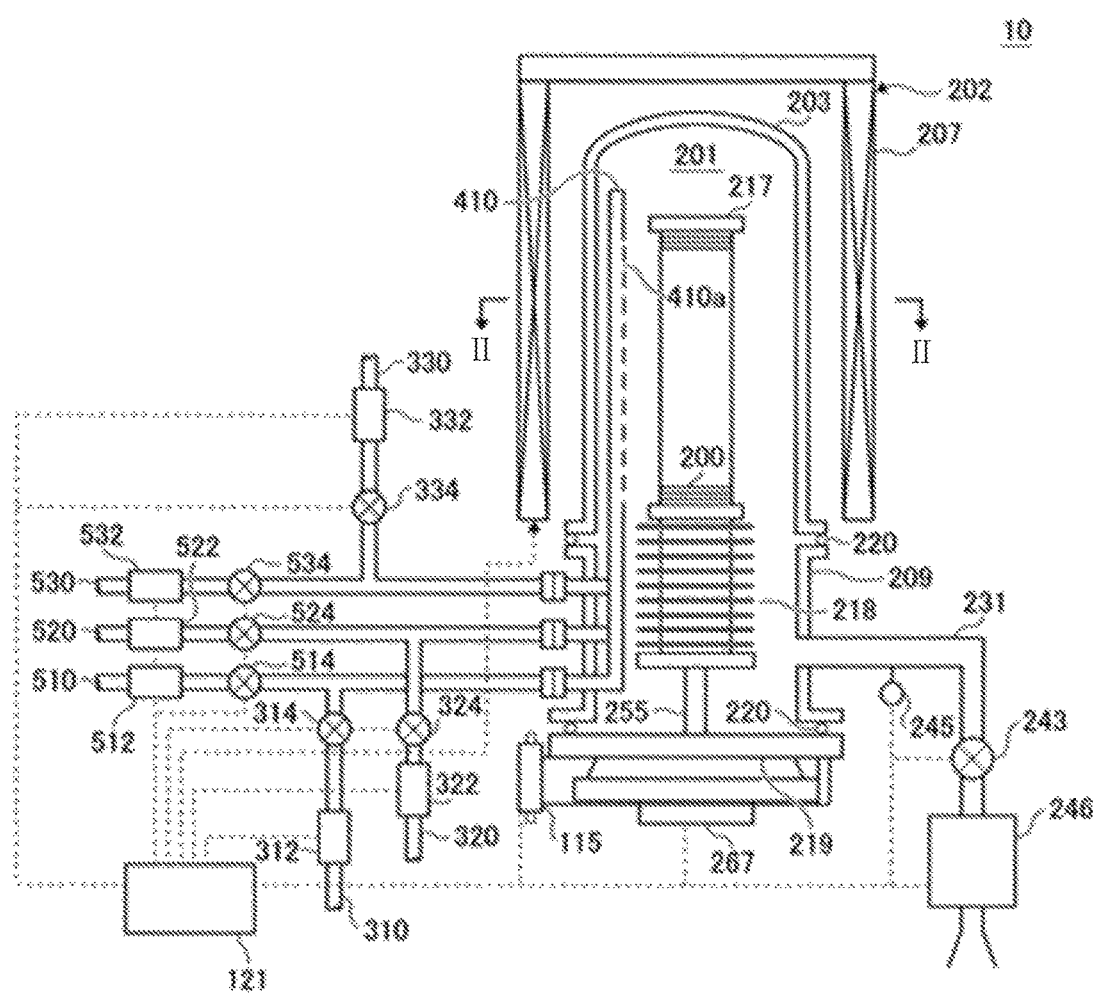
FIG. 1 is a schematic configuration view of a processing furnace of a substrate processing device suitably used in a first embodiment of the present disclosure, in which a portion of the processing furnace is shown in a vertical cross section.

In transistors, values of work functions required in a P-type transistor and an N-type transistor differ from each other. A work function value of 5.0 eV or more is required in the P-type transistor. A work function value of 4.3 eV or less is required in the N-type transistor. Depending on the intended use, there may be a case where other work function values are required. In this case, it is preferred that a work function can be adjusted (tuned, modulated or controlled) by a single film having the same element composition. For example, when forming a TiAlC film (titanium aluminum carbide film) as a metal film on a substrate, a concentration of carbon (C) is controlled. For example, by increasing a C concentration and reducing a work function value, it is possible to adjust a work function depending on the intended use.

However, in the case where a gas containing C and a metal element (a C- and metal element-containing gas), namely an organic metal-based gas (also referred to as an organic metal compound gas), is used as a process gas for the formation of a TiAlC film, it is difficult to independently control concentrations of C and a metal element. Thus, in the present disclosure, a metal film is formed by using a single (independent) carbon source (a C source or a carbon-containing gas), namely a metal-element-free organic gas, and a single (independent) metal source (a metal-containing gas), namely a C-free inorganic metal-based gas (also referred to as an inorganic metal compound gas). This makes it possible to independently control concentrations of C and a metal element.

First Embodiment of the Present Disclosure

Hereinafter, a first embodiment of the present disclosure will be described with reference to FIGS. 1 and 2. A substrate processing device 10 is configured as one example of a device used in a substrate processing process which is one type of manufacturing process of a semiconductor device.

(1) Configuration of Processing Furnace

A heater 207 as a heating means (a heating mechanism or a heating system) is installed in a processing furnace 202. The heater 207 is formed in a cylindrical shape with the upper side thereof closed.

A reaction tube 203 that constitutes a reaction vessel (process vessel) is disposed inside the heater 207 in a concentric relationship with the heater 207. The reaction tube 203 is made of a heat-resistant material (e.g., quartz ($SiO_2$) or silicon carbide (SiC)) and is formed in a cylindrical shape with the upper end thereof closed and the lower end thereof opened.

A manifold 209 made of a metallic material such as stainless steel or the like is installed in a lower end portion of the reaction tube 203. The manifold 209 is formed in a tubular shape. A lower end opening thereof is air-tightly closed by a seal cap 219 as a lid made of a metallic material such as stainless steel or the like. O-rings 220 as seal members are installed between the reaction tube 203 and the manifold 209 and between the manifold 209 and the seal cap 219. A process vessel is mainly configured by the reaction tube 203, the manifold 209 and the seal cap 219. A process chamber 201 is formed within the process vessel. The process chamber 201 is configured to accommodate wafers 200 as substrates which are in a horizontal posture and vertically aligned at multiple stages by a boat 217 to be described later.

A rotary mechanism 267 configured to rotate the boat 217 is installed at a side of the seal cap 219 opposite to the process chamber 201. A rotary shaft 255 of the rotary mechanism 267, which extends through the seal cap 219, is connected to the boat 217. The rotary mechanism 267 is configured to rotate the wafers 200 by rotating the boat 217. The seal cap 219 is configured to be vertically moved up and down by a boat elevator 115 which is an elevator mechanism vertically installed outside the reaction tube 203. The boat elevator 215 is configured to load and unload the boat 217 into and out of the process chamber 201 by moving the seal cap 219 up and down. That is to say, the boat elevator 115 is configured as a transfer device (transfer mechanism) which transfers the boat 217, ultimately the wafers 200, into and out of the process chamber 201.

The boat 217 serving as a substrate support is configured to support a plurality of wafers 200, e.g., 25 to 200 wafers, in such a state that the wafers 200 are arranged in a horizontal posture and at multiple stages along a vertical direction, namely arranged in a spaced-apart relationship, with the centers of the wafers 200 concentrically aligned with one another. The boat 217 is made of a heat-resistant material (e.g., quartz or SiC). Heat insulating plates 218 made of a heat-resistant material (e.g., quartz or SiC) are installed below the boat 217 in a horizontal posture and at multiple stages. With this configuration, it is difficult to transfer the heat generated in the heater 207 to the seal cap 219. However, the present embodiment is not limited to the above-described configuration. For example, instead of installing the heat insulating plates 218 below the boat 217, a heat insulating tube as a tubular member made of a heat-resistant material such as quartz or SiC may be installed below the boat 217. The heater 207 is capable of heating the wafers 200 accommodated within the process chamber 201 to a predetermined temperature.

Nozzles 410, 420 and 430 are installed in the process chamber 201 so as to penetrate a sidewall of the manifold 209. Gas supply pipes 310, 320 and 330 as gas supply lines are respectively connected to the nozzles 410, 420 and 430. In this way, three nozzles 410, 420 and 430 and three gas supply pipes 310, 320 and 330 are installed in the processing furnace 202 and are capable of supplying plural kinds of gases, specifically three kinds of gases (process gases or precursors), into the process chamber 201 via dedicated lines.

Mass flow controllers (MFC) 312, 322 and 332, which are flow rate controllers (flow rate control parts), and valves 314, 324 and 334, which are opening/closing valves, are installed in the gas supply pipes 310, 320 and 330 sequentially from the corresponding upstream sides, respectively. The nozzles 410, 420 and 430 are respectively connected to the tip portions of the gas supply pipes 310, 320 and 330. The nozzles 410, 420 and 430 are configured as L-shaped long nozzles. The horizontal portions of the nozzles 410, 420 and 430 are installed so as to penetrate the sidewall of the manifold 209. The vertical portions of the nozzles 410, 420 and 430 are installed in an annular space defined between the inner wall of the reaction tube 203 and the wafers 200, so as to extend upward (toward an upper side in a stacking direction of the wafers 200) along the inner wall of the reaction tube 203 (namely, so as to extend upward from one end side toward the other end side of a wafer arrangement region). That is to say, the nozzles 410, 420 and 430 are installed in a region existing at a lateral side of a wafer arrangement region, in which the wafer 200 are arranged, and horizontally surrounding the wafer arrangement region, so as to extend along the wafer arrangement region.

Gas supply holes 410a, 420a and 430a configured to supply (inject) gases are respectively installed on the side surfaces of the nozzles 410, 420 and 430. The gas supply holes 410a, 420a and 430a are respectively opened toward the center of the reaction tube 203. A plurality of the gas supply holes 410a, 420a and 430a are formed from the lower portion of the reaction tube 203 to the upper portion thereof. The respective gas supply holes 410a, 420a and 430a have the same opening area. Furthermore, the respective gas supply holes 410a, 420a and 430a are disposed at the same opening pitch.

In a gas supply method according to the present embodiment, gases are transferred via the nozzles 410, 420 and 430 disposed within an annular vertically-elongated space, namely a cylindrical space, defined by the inner wall of the reaction tube 203 and the end portions of the mounted wafers 200. The gases are initially injected from the gas supply holes 410a, 420a and 430a, which are respectively open in the nozzles 410, 420 and 430 into the reaction tube 203 near the wafers 200. The main streams of the gases within the reaction tube 203 are oriented in a direction parallel to the surfaces of the wafers 200, namely in a horizontal direction. With this configuration, there is provided an effect in that it is possible to uniformly supply the gases to the respective wafers 200 and to make the film thickness of a thin film formed on each of the wafers 200 uniform. In addition, the gases which have flowed over the surfaces of the respective wafers 200, namely the gases remaining after a reaction (residual gases), are moved toward an exhaust port (exhaust pipe 231) which will be described later. The flow direction of the residual gases is appropriately specified depending on the position of an exhaust port and is not limited to a vertical direction.

Carrier gas supply pipes 510, 520 and 530 for supplying a carrier gas are respectively connected to the gas supply pipes 310, 320 and 330. MFCs 512, 522 and 532 and valves 514, 524 and 534 are respectively installed in the carrier gas supply pipes 510, 520 and 530.

As one example of the aforementioned configuration, a first precursor gas containing a first metal element and not containing carbon (C) (first metal-containing gas) as a process gas is supplied from the gas supply pipe 310 into the process chamber 201 via the MFC 312, the valve 314 and the nozzle 410. For example, titanium tetrachloride ($TiCl_4$), which is a Ti-containing precursor containing titanium (Ti) as a first metal element, is used as a first precursor. $TiCl_4$ is a C-free metal precursor, namely an inorganic metal-based precursor (inorganic metal compound). $TiCl_4$ acts as a Ti source at a substrate processing step which will be described later. Furthermore, Ti is classified as a transition metal element.

From the gas supply pipe 320, as a process gas, a second precursor gas containing a second metal element differing from the first metal element and not containing carbon (C) (second metal-containing gas) is supplied into the process chamber 201 via the MFC 322, the valve 324 and the nozzle 420. For example, aluminum trichloride ($AlCl_3$), which is an Al-containing precursor containing aluminum (Al) as a second metal element is used as a second precursor. $AlCl_3$ is a C-free metal precursor, namely an inorganic metal-based precursor (inorganic metal compound). $AlCl_3$ acts as an Al source at a substrate processing step which will be described later. Furthermore, Al is classified as a typical metal element.

From the gas supply pipe 330, as a process gas, a C-containing gas as a reaction gas containing carbon (C) is supplied into the process chamber 201 via the MFC 332, the valve 334 and the nozzle 430. A C-containing gas not containing a metal element, for example, a propylene ($C_3H_6$) gas as a hydrocarbon-based gas, may be used as the C-containing gas. The $C_3H_6$ gas acts as a C source at a substrate processing step which will be described later. It is preferred that the C-containing gas is a nitrogen (N)-free gas and a silicon (Si)-free gas.

From the carrier gas supply pipes 510, 520 and 530, as an inert gas, for example, a nitrogen ($N_2$) gas is supplied into the process chamber 201 via the MFCs 512, 522 and 532, the valves 514, 524 and 534 and the nozzles 410, 420 and 430.

In the present disclosure, the precursor gas refers to a gaseous precursor, for example, a gas obtained by vaporizing or sublimating a precursor which stays in a liquid state or a solid state under room temperature and atmospheric pressure, or a precursor which stays in a gaseous state under room temperature and atmospheric pressure. When the term "precursor" is used herein, it may refer to "a liquid precursor staying in a liquid state," "a solid precursor staying in a solid state," "a precursor gas staying in a gaseous state," or a composite thereof. In the case of using a liquid precursor such as $TiCl_4$ or the like which stays in a liquid state under room temperature and atmospheric pressure, or a solid precursor such as $AlCl_3$ or the like which stays in a solid state under room temperature and atmospheric pressure, the liquid precursor or the solid precursor is vaporized or sublimated by a system such as a vaporizer, a bubbler or a sublimator and is supplied as a precursor gas (a $TiCl_4$ gas, an $AlCl_3$ gas, etc.).

In the case where the aforementioned process gases are supplied from the gas supply pipes 310, 320 and 330, a process gas supply system is mainly configured by the gas supply pipes 310, 320 and 330, the MFCs 312, 322 and 332, and the valves 314, 324 and 334. The nozzles 410, 420 and 430 may be included in the process gas supply system. The process gas supply system may be simply referred to as a gas supply system.

In the case where the aforementioned precursor gases are supplied from the gas supply pipes 310 and 320, a precursor gas supply system is mainly configured by the gas supply pipes 310 and 320, the MFCs 312 and 322, and the valves 314 and 324. The nozzles 410 and 420 may be included in the precursor gas supply system. The precursor gas supply system may be simply referred to as a precursor supply system.

In the case where the Ti-containing gas (Ti source) as the process gas is supplied from the gas supply pipe 310, a Ti-containing gas supply system is mainly configured by the gas supply pipe 310, the MFC 312 and the valve 314. The nozzle 410 may be included in the Ti-containing gas supply system. The Ti-containing gas supply system may be referred to as a Ti-containing precursor supply system or may be simply referred to as a Ti precursor supply system. In the case where the $TiCl_4$ gas is supplied from the gas supply pipe 310, the Ti-containing gas supply system may be referred to as a $TiCl_4$ gas supply system. The $TiCl_4$ gas supply system may be referred to as a $TiCl_4$ supply system.

In the case where the Al-containing gas (Al source) as the process gas is supplied from the gas supply pipe 320, an Al-containing gas supply system is mainly configured by the gas supply pipe 320, the MFC 322 and the valve 324. The nozzle 420 may be included in the Al-containing gas supply system. The Al-containing gas supply system may be referred to as an Al-containing precursor supply system or may be simply referred to as an Al precursor supply system. In the case where the $AlCl_3$ gas is supplied from the gas supply pipe 320, the Al-containing gas supply system may be referred to as an $AlCl_3$ gas supply system. The $AlCl_3$ gas supply system may be referred to as an $AlCl_3$ supply system.

In the case where the reaction gas as the process gas is supplied from the gas supply pipe 330, a reaction gas supply system is mainly configured by the gas supply pipe 330, the MFC 332 and the valve 334. The nozzle 430 may be included in the reaction gas supply system. In the case where the C-containing gas (C source) is supplied as the reaction gas, the reaction gas supply system may be referred to as a C-containing gas supply system. In the case where the $C_3H_6$ gas is supplied from the gas supply pipe 330, the C-containing gas supply system may be referred to as a $C_3H_6$ gas supply system. The $C_3H_6$ gas supply system may be referred to as a $C_3H_6$ supply system.

Furthermore, a carrier gas supply system is mainly configured by the carrier gas supply pipes 510, 520 and 530, the MFCs 512, 522 and 532, and the valves 514, 524 and 534. In the case where the inert gas is supplied as the carrier gas, the carrier gas supply system may be referred to as an inert gas supply system. Since the inert gas also acts as a purge gas, the inert gas supply system may be referred to as a purge gas supply system.

An exhaust pipe 231 configured to exhaust an internal atmosphere of the process chamber 201 is installed in the manifold 209. Similar to the nozzles 410, 420 and 430, the exhaust pipe 231 is installed so as to penetrate the sidewall of the manifold 209. As illustrated in FIG. 2, the exhaust pipe 231 is installed in a position opposing the nozzles 410, 420 and 430 across the wafers 200 in a plane view. With this configuration, the gases supplied from the gas supply holes 410a, 420a and 430a to the vicinity of the wafers 200 existing within the process chamber 201 flow in a horizontal direction, namely in a direction parallel to the surfaces of the wafers 200 and then flow downward. The gases are exhausted from the exhaust pipe 231. As described above, the main streams of the gases within the process chamber 201 are oriented in the horizontal direction.

A pressure sensor 245 as a pressure detector (pressure detecting part) configured to detect an internal pressure of the process chamber 201, an APC (Auto Pressure Controller) valve 243 as a pressure controller (pressure control part) configured to control the internal pressure of the process chamber 201, and a vacuum pump 246 as a vacuum exhaust device are installed in the exhaust pipe 231 sequentially from the upstream side. By opening or closing the APC valve 243 while operating the vacuum pump 246, it is possible to perform or stop evacuation of the interior of the process chamber 201. Furthermore, by adjusting an opening degree of the APC valve 243 based on the pressure information detected by the pressure sensor 245 while operating the vacuum pump 246, it is possible to regulate the internal pressure of the process chamber 201. The APC valve 243 constitutes a portion of an exhaust flow path of an exhaust system. The APC valve 243 serves not only as a pressure regulating part but also as an exhaust flow path opening/closing part, namely an exhaust valve, which is capable of closing, ultimately sealing the exhaust flow path of the exhaust system. Moreover, there may be a case where a trap device configured to capture a reaction byproduct, an unreacted precursor gas or the like existing in an exhaust gas or a detoxifying device configured to detoxify a corrosive ingredient, a toxic component or the like contained in an exhaust gas is connected to the exhaust pipe 231. An exhaust system, namely an exhaust line, is mainly configured by the exhaust pipe 231, the APC valve 243 and the pressure sensor 245. Furthermore, the vacuum pump 246 may be included in the exhaust system. Moreover, the trap device or the detoxifying device may be included in the exhaust system.

A temperature sensor 263 serving as a temperature detector is installed within the reaction tube 203. Based on temperature information detected by the temperature sensor 263, a state of supplying electric power to the heater 207 is adjusted such that the interior of the process chamber 201 has a desired temperature distribution. Similar to the nozzles 410, 420 and 430, the temperature sensor 263 is formed in an L-shape. The temperature sensor 263 is installed along the inner wall of the reaction tube 203.

Figure 3:
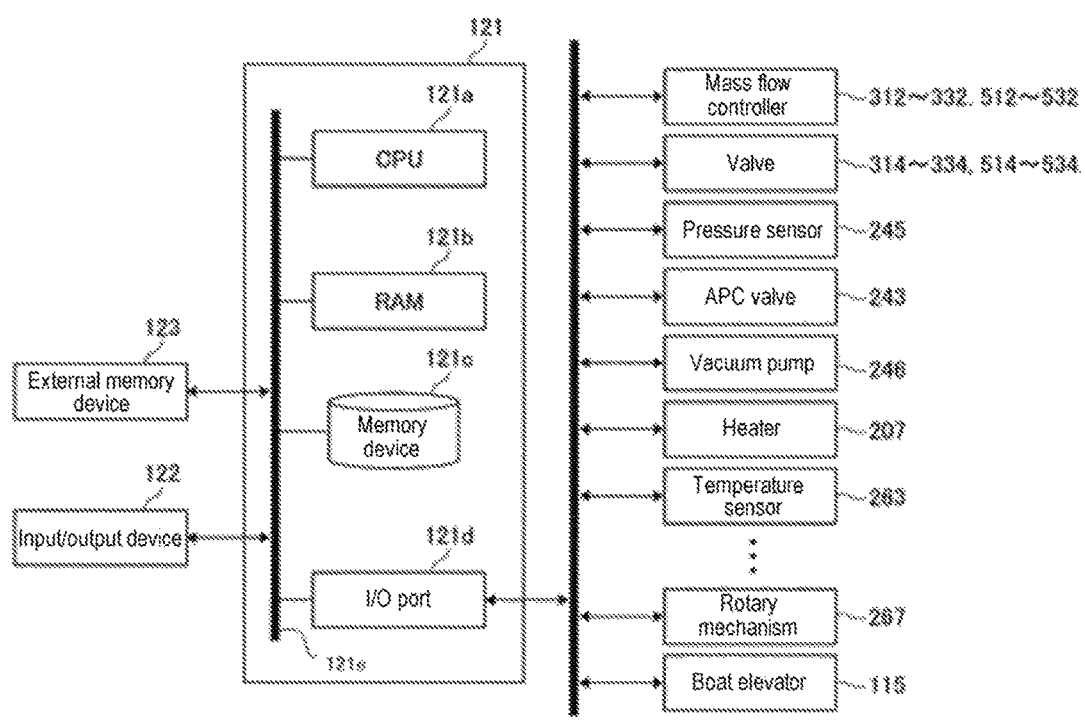
FIG. 3 is a block diagram illustrating the configuration of a controller of the substrate processing device illustrated in FIG. 1.

As illustrated in FIG. 3, a controller 121, which is a control part (control means), may be configured as a computer including a CPU (Central Processing Unit) 121a, a RAM (Random Access Memory) 121b, a memory device 121c and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured by a flash memory, a HDD (Hard Disc Drive), or the like. A control program for controlling operations of a substrate processing device or a process recipe, in which a sequence, condition, or the like for processing a substrate to be described later is written, is readably stored in the memory device 121c. The process recipe functions as a program designed to cause the controller 121 to execute each sequence in the substrate processing process which will be described later, so as to obtain a predetermined result. Hereinafter, the process recipe and the control program will be generally and simply referred to as a "program." Furthermore, the process recipe will be simply referred to as a "recipe". When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the MFCs 312, 322, 332, 512, 522 and 532, the valves 314, 324, 334, 514, 524 and 534, the APC valve 243, the pressure sensor 245, the vacuum pump 246, the heater 207, the temperature sensor 263, the rotary mechanism 267, the boat elevator 115, and the like.

The CPU 121a is configured to read the control program from the memory device 121c and to execute the control program. The CPU 121a is also configured to read the process recipe from the memory device 121c according to an input of an operation command or the like from the input/output device 122. The CPU 121a is configured to control the flow rate adjusting operations of various kinds of gases performed by the MFCs 312, 322, 332, 512, 522 and 532, the opening/closing operations of the valves 314, 324, 334, 514, 524 and 534, the opening/closing operation of the APC valve 243, the pressure regulating operation performed by the APC valve 243 based on the pressure sensor 245, the temperature adjusting operation performed by the heater 207 based on the temperature sensor 263, the start/stop of the vacuum pump 246, the operation of rotating the boat 217 with the rotary mechanism 267 and adjusting the rotation speed of the boat 217, the operation of moving the boat 217 up and down with the boat elevator 115, and the like, according to the read process recipe.

The controller 121 may be configured by installing into a computer the aforementioned program stored in an external memory device 123 (for example, a magnetic tape, a magnetic disc such as a flexible disc or a hard disc, an optical disc such as a CD or a DVD, a magneto-optical disc such as an MO, a semiconductor memory such as a USB memory or a memory card). The memory device 121c or the external memory device 123 is configured as a computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. In addition, the program may be provided to the computer using a communication means such as the Internet or a dedicated line without having to use the external memory device 123.

(2) Substrate Processing Process

An example of a process for forming, e.g., a metal film constituting a gate electrode on a substrate, which is one of the processes for manufacturing a semiconductor device (apparatus), will now be described with reference to FIG. 4. The process for forming the metal film is implemented using the processing furnace 202 of the substrate processing device 10 described above. In the following descriptions, the operations of the respective parts constituting the substrate processing device 10 are controlled by the controller 121.

In a preferred film forming sequence (simply referred to as a sequence) of the present embodiment, a metal carbide film (e.g., a TiAlC film) as a metal film is formed on a wafer 200 by time-divisionally performing, a predetermined number of times, a step of supplying a first precursor gas (e.g., a $TiCl_4$ gas) containing a first metal element (e.g., Ti) and not containing C to the wafer 200, a step of supplying a second precursor gas (e.g., an $AlCl_3$ gas) containing a second metal element (e.g., Al) differing from the first metal element and not containing C to the wafer 200, and a step of supplying a reaction gas (e.g., a $C_3H_6$ gas) containing C to the wafer 200. The TiAlC film may be referred to as a metal carbide-based film.

Figure 4:
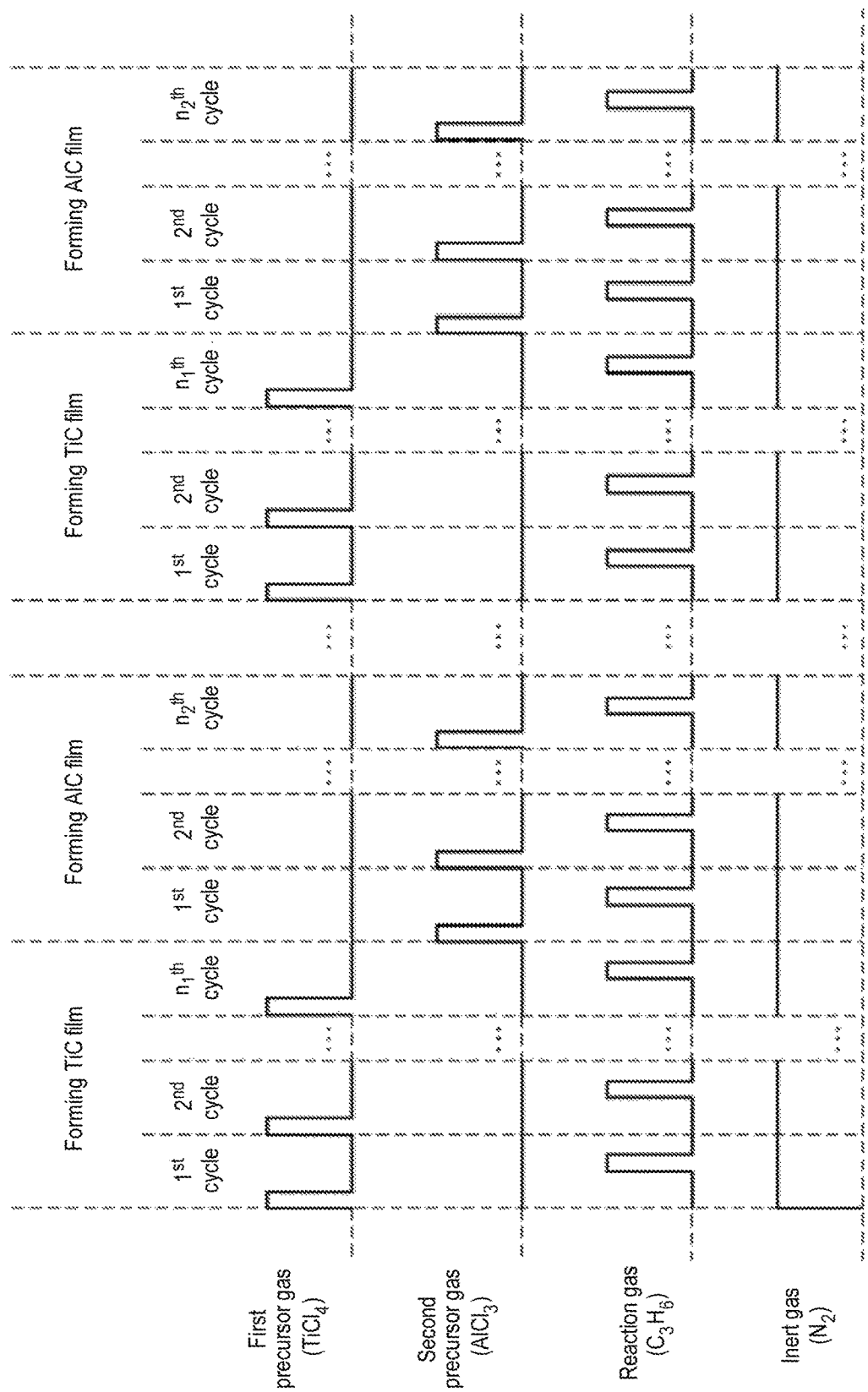
FIG. 4 is a view illustrating a sequence according to a first embodiment of the present disclosure.

Specifically, as in the sequence illustrated in FIG. 4, a titanium aluminum carbide film (TiAlC film) including Ti, Al and C at a predetermined ratio is formed on the wafer 200 by performing, a predetermined number of times ($n_3$ times), a process which time-divisionally performs:

a step of forming a titanium carbide film (TiC film) by performing, a predetermined number of times ($n_1$ times), a cycle which time-divisionally performs a step of supplying a $TiCl_4$ gas and a step of supplying a $C_3H_6$ gas; and a step of forming an aluminum carbide film (AlC film) by performing, a predetermined number of times ($n_2$ times), a cycle which time-divisionally performs a step of supplying an $AlCl_3$ gas and a step of supplying a $C_3H_6$ gas.

By the expression "performs a process (also referred to as a cycle, a step or the like) a predetermined number of times" used herein, it is meant that the process is performed once or multiple times. That is to say, it is meant that the process is performed once or more. FIG. 4 illustrates an example in which the respective processes (cycles) are alternately repeated by n cycles. The number of performing times of the respective processes is appropriately selected depending on the ratio of Ti, Al and C required in the finally-formed TiAlC film. That is to say, the number of performing times of the respective processes described above is determined according to a work function of a target gate electrode.

By the expression "time-divisionally" used herein, it is meant that a time period is divided (separated). For example, by the expression "time-divisionally performs the respective processes", it is meant that the respective processes are performed non-synchronously, namely without synchronization. In other words, it is meant that the respective processes are performed intermittently (pulse-wise) and alternately. That is to say, it is meant that the process gases supplied in the respective processes are supplied so as not to be mixed with each other. In the case of performing the respective processes multiple times, the process gases supplied in the respective processes are alternately supplied so as not to be mixed with each other.

As used herein, the term "wafer" may refer to "a wafer itself" or "a laminated body (an assembly) of a wafer and a predetermined layer, film, or the like formed on a surface of the wafer". That is to say, a wafer including a predetermined layer, film, or the like formed on its surface may be referred to as a wafer. In addition, as used herein, the phrase "a surface of a wafer" may refer to "a surface (exposed surface) of a wafer itself" or "a surface of a predetermined layer, film, or the like formed on a wafer, namely an uppermost surface of a wafer as a laminated body."

As used herein, the expression "a predetermined gas is supplied to a wafer" may mean that "a predetermined gas is directly supplied to a surface (exposed surface) of a wafer itself" or that "a predetermined gas is supplied to a layer or film formed on a wafer, namely on an uppermost surface of a wafer as a laminated body." Also, as used herein, the expression "a predetermined layer (or film) is formed on a wafer" may mean that "a predetermined layer (or film) is directly formed on a surface (exposed surface) of a wafer itself" or that "a predetermined layer (or film) is formed on a layer or film formed on a wafer, namely on an uppermost surface of a wafer as a laminated body."

In addition, the term "substrate" as used herein may be synonymous with the term "wafer." In this case, it may be considered that the terms "wafer" and "substrate" are interchangeable in the above descriptions.

As used herein, the term "metal film" refers to a film composed of a conductive material including metal atoms (also simply referred to as a conductive film). The metal film includes a conductive metal nitride film (a metal nitride film), a conductive metal oxide film (a metal oxide film), a conductive metal oxynitride film (a metal oxynitride film), a conductive metal oxycarbide film (a metal oxycarbide film), a conductive metal composite film, a conductive metal alloy film, a conductive metal silicide film (a metal silicide film), a conductive metal carbide film (a metal carbide film), a conductive metal carbonitride film (a metal carbonitride film), and so forth. The TiAlC film (a titanium aluminum carbide film) is a conductive metal carbide film.

(Wafer Charging and Boat Loading)

Figure 2:
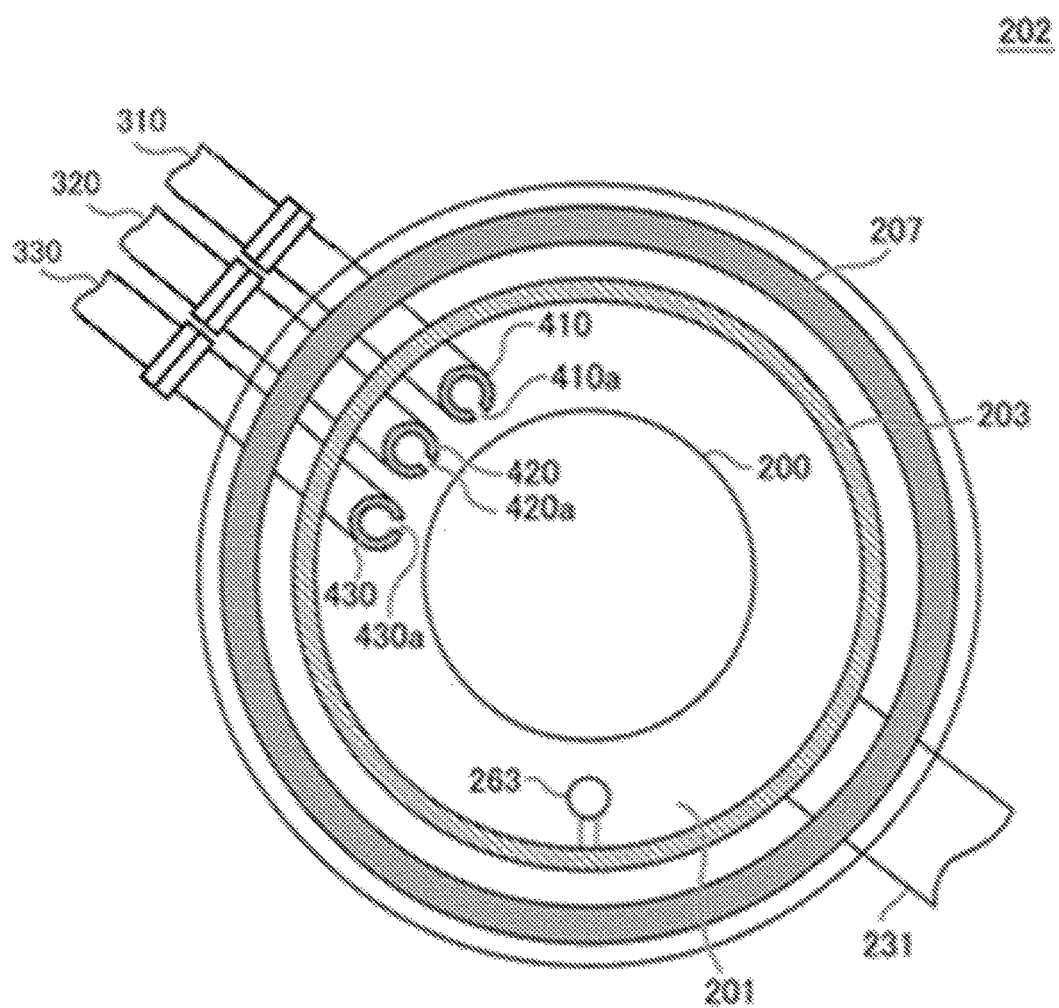
FIG. 2 is a sectional view taken along line II-II in FIG. 1.

If a plurality of wafers 200 is loaded into the boat 217 (wafer charging), as illustrated in FIG. 1, the boat 217 charged with the plurality of wafers 200 is lifted up by the boat elevator 115 and is loaded into the process chamber 201 (boat loading). In this state, the seal cap 219 closes the lower end opening of the manifold 209 through the O-ring 220.

(Pressure Regulation and Temperature Adjustment)

The interior of the process chamber 201 is evacuated by the vacuum pump 246 so as to reach a desired pressure (desired vacuum level). At this time, the internal pressure of the process chamber 201 is measured by the pressure sensor 245. The APC valve 243 is feedback-controlled based on the measured pressure information (pressure regulation). The vacuum pump 246 may be continuously kept operated at least until the processing of the wafers 200 is completed. The wafers 200 in the process chamber 201 are heated by the heater 207 to a desired temperature. At this time, the amount of electric power supplied to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 may be continuously performed at least until the processing of the wafers 200 is completed. Subsequently, the boat 217 and the wafers 200 begin to be rotated by the rotary mechanism 267. The rotation of the boat 217 and the wafers 200 by the rotary mechanism 267 may be continuously performed at least until the processing of the wafers 200 is completed.

(TiC Film Forming Step)

Subsequently, a step of forming a TiC film is performed. The TiC film forming step includes a $TiCl_4$ gas supply step, a residual gas removal step, a $C_3H_6$ gas supply step and a residual gas removal step, which will be described below.

($TiCl_4$ Gas Supply Step)

The valve 314 is opened to allow a $TiCl_4$ gas to flow through the gas supply pipe 310. The flow rate of the $TiCl_4$ gas flowing through the gas supply pipe 310 is adjusted by the MFC 312. The $TiCl_4$ gas is supplied from the gas supply hole 410a of the nozzle 410 into the process chamber 201 and is exhausted from the exhaust pipe 231. At this time, the $TiCl_4$ gas is supplied to the wafers 200. That is to say, the surfaces of the wafers 200 are exposed to the $TiCl_4$ gas. Simultaneously, the valve 514 is opened to allow a $N_2$ gas to flow through the carrier gas supply pipe 510. The flow rate of the $N_2$ gas flowing through the carrier gas supply pipe 510 is adjusted by the MFC 512. The $N_2$ gas is supplied into the process chamber 201 together with the $TiCl_4$ gas and is exhausted from the exhaust pipe 231. At this time, in order to prevent infiltration of the $TiCl_4$ gas into the nozzles 420 and 430, the valves 524 and 534 are opened to allow the $N_2$ gas to flow through the carrier gas supply pipes 520 and 530. The $N_2$ gas is supplied into the process chamber 201 via the gas supply pipes 320 and 330 and the nozzles 420 and 430 and is exhausted from the exhaust pipe 231.

The internal pressure of the process chamber 201 is set at a predetermined pressure falling within a range of, e.g., 1 to 10,000 Pa, by appropriately adjusting the APC valve 243. The supply flow rate of the $TiCl_4$ gas controlled by the MFC 312 is set at a predetermined flow rate falling within a range of, e.g., 10 to 10,000 sccm. The supply flow rate of the $N_2$ gas controlled by the MFCs 512, 522 and 532 is set at a predetermined flow rate falling within a range of, e.g., 10 to 10,000 sccm. The time for supplying the $TiCl_4$ gas to the wafers 200, namely the gas supply time (irradiation time), is set at a predetermined time falling within a range of, e.g., 0.1 to 120 seconds. At this time, the temperature of the heater 207 is set at such a temperature that the temperature of the wafers 200 becomes a temperature falling within a range of, e.g., 200 to 500 degrees C. Preferably, the temperature of the heater 207 is set at a temperature falling within a range of 200 to 400 degrees C. Only the $TiCl_4$ gas and the $N_2$ gas are supplied into the process chamber 201. By virtue of the supply of the $TiCl_4$ gas, a Ti-containing layer having a thickness of, e.g., from less than one atomic layer to several atomic layers, is formed on the wafer 200 (on the underlying film of the surface of the wafer 200).

The Ti-containing layer may be a Ti layer, a $TiCl_4$ layer which is an adsorption layer of $TiCl_4$, or a layer including the Ti layer and the $TiCl_4$ layer. The Ti layer includes not only a continuous layer composed of Ti but also a discontinuous layer. That is to say, the Ti layer includes a Ti deposition layer having a thickness of from less than one atomic layer to several atomic layers, which is composed of Ti. The $TiCl_4$ layer includes not only a continuous adsorption layer of $TiCl_4$ molecules but also a discontinuous adsorption layer thereof. That is to say, the $TiCl_4$ layer includes an adsorption layer having a thickness of one molecular layer or less than one molecular layer, which is composed of $TiCl_4$ molecules. The $TiCl_4$ molecules that constitute the $TiCl_4$ layer include molecules in which bonds of Ti and Cl are partially broken. That is to say, the $TiCl_4$ layer includes a physical adsorption layer of $TiCl_4$ or a chemisorption layer thereof. However, under the aforementioned processing conditions, chemisorption of $TiCl_4$ onto the wafer 200 is more predominant than physical adsorption of $TiCl_4$ onto the wafer 200.

In this regard, the layer having a thickness of less than one atomic layer refers to a discontinuously-formed atomic layer. The layer having a thickness of one atomic layer refers to a continuously-formed atomic layer. The layer having a thickness of less than one molecular layer refers to a discontinuously-formed molecular layer. The layer having a thickness of one molecular layer refers to a continuously-formed molecular layer. This holds true in the examples which will be described later.

If the temperature of the wafer 200 is less than 200 degrees C., a substitution reaction between the Ti-containing layer formed on the wafer 200 and the $C_3H_6$ gas may be difficult to occur at a $C_3H_6$ gas supply step which will be described later. On the other hand, if the temperature of the wafer 200 exceeds 500 degrees C., an excessive gas phase reaction occurs. Thus, the film thickness uniformity is likely to worsen and the control of the film thickness uniformity may be difficult. Accordingly, it is preferred that the temperature of the wafer 200 is set at a temperature falling within a range of 200 degrees C. or more and 500 degrees C. or less.

(Residual Gas Removal Step)

After the Ti-containing layer is formed, the valve 314 is closed to stop the supply of the $TiCl_4$ gas. At this time, the interior of the process chamber 201 is evacuated by the vacuum pump 246 while opening the APC valve 243. Thus, the $TiCl_4$ gas remaining within the process chamber 201, which has not reacted or which has contributed to the formation of the Ti-containing layer, is removed from the interior of the process chamber 201. That is to say, the $TiCl_4$ gas remaining in a space where the wafer 200 having the Ti-containing layer exists, which has not reacted or which has contributed to the formation of the Ti-containing layer, is removed. At this time, the supply of the $N_2$ gas into the process chamber 201 is maintained while opening the valves 514, 524 and 534. The $N_2$ gas acts as a purge gas and can enhance the effect of removing the $TiCl_4$ gas remaining within the process chamber 201, which has not reacted or which has contributed to the formation of the Ti-containing layer, from the interior of the process chamber 201.

At this time, the gas remaining within the process chamber 201 may not be completely removed and the interior of the process chamber 201 may not be completely purged. If the gas remaining within the process chamber 201 is small in amount, no adverse effect is generated at the step performed thereafter. The flow rate of the $N_2$ gas supplied into the process chamber 201 need not be made large. For example, by supplying the $N_2$ gas in an amount substantially equal to the volume of the reaction tube 203 (the process chamber 201), it is possible to perform purging to such an extent that no adverse effect is generated at the step performed thereafter. By not completely purging the interior of the process chamber 201 in this way, it is possible to shorten the purging time and to improve the throughput. It is also possible to suppress the consumption of the $N_2$ gas to a necessary minimum level.

($C_3H_6$ Gas Supply Step)

After removing the residual gas remaining within the process chamber 201, the valve 334 is opened to allow the $C_3H_6$ gas to flow through the gas supply pipe 330. The flow rate of the $C_3H_6$ gas flowing through the gas supply pipe 330 is adjusted by the MFC 332. The $C_3H_6$ gas is supplied from the gas supply hole 430a of the nozzle 430 into the process chamber 201 and is exhausted from the exhaust pipe 231. At this time, the $C_3H_6$ gas is supplied to the wafers 200. That is to say, the surfaces of the wafers 200 are exposed to the $C_3H_6$ gas. Simultaneously, the valve 534 is opened to allow a $N_2$ gas to flow through the carrier gas supply pipe 530. The flow rate of the $N_2$ gas flowing through the carrier gas supply pipe 530 is adjusted by the MFC 532. The $N_2$ gas is supplied into the process chamber 201 together with the $C_3H_6$ gas and is exhausted from the exhaust pipe 231. At this time, in order to prevent infiltration of the $C_3H_6$ gas into the nozzles 410 and 420, the valves 514 and 524 are opened to allow the $N_2$ gas to flow through the carrier gas supply pipes 510 and 520. The $N_2$ gas is supplied into the process chamber 201 via the gas supply pipes 310 and 320 and the nozzles 410 and 420 and is exhausted from the exhaust pipe 231.

When supplying the $C_3H_6$ gas, the internal pressure of the process chamber 201 is set at a predetermined pressure falling within a range of, e.g., 1 to 10,000 Pa, by appropriately adjusting the APC valve 243. The supply flow rate of the $C_3H_6$ gas controlled by the MFC 332 is set at a predetermined flow rate falling within a range of, e.g., 10 to 50,000 sccm. The supply flow rate of the $N_2$ gas controlled by the MFCs 512, 522 and 532 is set at a predetermined flow rate falling within a range of, e.g., 10 to 10,000 sccm. The time for supplying the $C_3H_6$ gas to the wafers 200, namely the gas supply time (irradiation time), is set at a predetermined time falling within a range of, e.g., 0.1 to 120 seconds. At this time, the temperature of the heater 207 is set at a temperature equal to the temperature used at the $TiCl_4$ gas supply step.

At this time, only the $C_3H_6$ gas and the $N_2$ gas are supplied into the process chamber 201. The $C_3H_6$ gas makes substitution reaction with at least a portion of the Ti-containing layer formed on the wafer 200 at the $TiCl_4$ gas supply step. During the substitution reaction, Ti included in the Ti-containing layer and C included in the $C_3H_6$ gas are bonded to each other, whereby C is adsorbed onto the Ti-containing layer. Most of chlorine (Cl) included in the Ti-containing layer is bonded to hydrogen (H) included in the $C_3H_6$ gas, whereby Cl is extracted or desorbed from the Ti-containing layer. Thus, Cl is separated from the Ti-containing layer as a reaction byproduct (also referred to as a byproduct or an impurity) such as HCl or the like. Consequently, a layer including Ti and C (hereinafter simply referred to as a TiC layer) is formed on the wafer 200. Since the TiC layer includes a Ti—C bond, the TiC layer may be referred to as a layer including a Ti—C bond and may be referred to as a TiC-containing layer.

(Residual Gas Removal System)

After the TiC layer is formed, the valve 334 is closed to stop the supply of the $C_3H_6$ gas. At this time, the interior of the process chamber 201 is evacuated by the vacuum pump 246 while opening the APC valve 243. Thus, the $C_3H_6$ gas remaining within the process chamber 201, which has not reacted or which has contributed to the formation of the TiC layer, or the byproduct remaining within the process chamber 201 is removed from the interior of the process chamber 201. That is to say, the $C_3H_6$ gas remaining in a space where the wafer 200 having the TiC layer exists, which has not reacted or which has contributed to the formation of the TiC layer, or the byproduct remaining in the space where the wafer 200 having the TiC layer exists, is removed. At this time, the supply of the $N_2$ gas into the process chamber 201 is maintained while opening the valves 514, 524 and 534. The $N_2$ gas acts as a purge gas and, therefore, can enhance the effect of removing the $C_3H_6$ gas remaining within the process chamber 201, which has not reacted or which has contributed to the formation of the TiC layer, or the byproduct remaining within the process chamber 201, from the interior of the process chamber 201.

At this time, similar to the residual gas removal step performed after the $TiCl_4$ gas supply step, the gas remaining within the process chamber 201 may not be completely removed and the interior of the process chamber 201 may not be completely purged.

(Performing a Predetermined Number of Times)

A TiC film (first metal film) having a predetermined thickness (e.g., a thickness of 0.1 to 10 nm) is formed on the wafer 200 by performing, once or more (a predetermined number of times), a cycle which sequentially and time-divisionally performs the $TiCl_4$ gas supply step, the residual gas removal step, the $C_3H_6$ gas supply step and the residual gas removal step, namely by performing, $n_1$ cycles (where $n_1$ is an integer of 1 or more), one cycle including the $TiCl_4$ gas supply step, the residual gas removal step, the $C_3H_6$ gas supply step and the residual gas removal step. The aforementioned cycle may be repeated multiple times.

In the case of performing the cycle multiple times, at the respective steps of at least the second cycle and the subsequent cycles, the expression "a gas is supplied to the wafer 200" means that "a predetermined gas is supplied to the layer formed on the wafer 200, namely to the uppermost surface of the wafer 200 as a laminated body." The expression "a predetermined layer is formed on the wafer 200" means that "a predetermined layer is formed on the layer formed on the wafer 200, namely on the uppermost surface of the wafer 200 as a laminated body." This holds true in the examples which will be described later.

(AlC Film Forming Step)

Subsequently, a step of forming an AlC film is performed. The AlC film forming step includes an $AlCl_3$ gas supply step, a residual gas removal step, a $C_3H_6$ gas supply step and a residual gas removal step, which will be described below.

($AlCl_3$ Gas Supply Step)

The valve 324 is opened to allow an $AlCl_3$ gas to flow through the gas supply pipe 320. The flow rate of the $AlCl_3$ gas flowing through the gas supply pipe 320 is adjusted by the MFC 322. The $AlCl_3$ gas is supplied from the gas supply hole 420a of the nozzle 420 into the process chamber 201 and is exhausted from the exhaust pipe 231. At this time, the $AlCl_3$ gas is supplied to the wafers 200. That is to say, the surfaces of the wafers 200 are exposed to the $AlCl_3$ gas. Simultaneously, the valve 524 is opened to allow a $N_2$ gas to flow through the carrier gas supply pipe 520. The flow rate of the $N_2$ gas flowing through the carrier gas supply pipe 520 is adjusted by the MFC 522. The $N_2$ gas is supplied into the process chamber 201 together with the $AlCl_3$ gas and is exhausted from the exhaust pipe 231. At this time, in order to prevent infiltration of the $AlCl_3$ gas into the nozzles 410 and 430, the valves 514 and 534 are opened to allow the $N_2$ gas to flow through the carrier gas supply pipes 510 and 530. The $N_2$ gas is supplied into the process chamber 201 via the gas supply pipes 310 and 330 and the nozzles 410 and 430 and is exhausted from the exhaust pipe 231.

At this time, the internal pressure of the process chamber 201 is set at a predetermined pressure falling within a range of, e.g., 1 to 10,000 Pa, by appropriately adjusting the APC valve 243. The supply flow rate of the $AlCl_3$ gas controlled by the MFC 322 is set at a predetermined flow rate falling within a range of, e.g., 10 to 10,000 sccm. The supply flow rate of the $N_2$ gas controlled by the MFCs 512, 522 and 532 is set at a predetermined flow rate falling within a range of, e.g., 10 to 10,000 sccm. The time for supplying the $AlCl_3$ gas to the wafers 200, namely the gas supply time (irradiation time), is set at a predetermined time falling within a range of, e.g., 0.1 to 120 seconds. At this time, the temperature of the heater 207 is set at a temperature equal to the temperature used at the $TiCl_4$ gas supply step. Only the $AlCl_3$ gas and the $N_2$ gas are supplied into the process chamber 201. By virtue of the supply of the $AlCl_3$ gas, an Al-containing layer having a thickness of, e.g., from less than one atomic layer to several atomic layers, is formed on the wafer 200 (on the underlying film of the surface of the wafer 200, namely the TiC layer).

The Al-containing layer may be an Al layer, an $AlCl_3$ layer which is an adsorption layer of $AlCl_3$, or a layer including the Al layer and the $AlCl_3$ layer. The Al layer includes not only a continuous layer composed of Al but also a discontinuous layer. That is to say, the Al layer includes an Al deposition layer having a thickness of from less than one atomic layer to several atomic layers, which is composed of Al. The $AlCl_3$ layer includes not only a continuous adsorption layer of $AlCl_3$ molecules but also a discontinuous adsorption layer thereof. That is to say, the $AlCl_3$ layer includes an adsorption layer having a thickness of one molecular layer or less than one molecular layer, which is composed of $AlCl_3$ molecules. The $AlCl_3$ molecules that constitute the $AlCl_3$ layer include molecules in which bonds of Al and Cl are partially broken. That is to say, the $AlCl_3$ layer includes a physical adsorption layer of $AlCl_3$ or a chemisorption layer thereof. However, under the aforementioned processing conditions, chemisorption of $AlCl_3$ onto the wafer 200 is more predominant than physical adsorption of $AlCl_3$ onto the wafer 200.

(Residual Gas Removal System)

After the Al-containing layer is formed, the valve 324 is closed to stop the supply of the $AlCl_3$ gas. At this time, the interior of the process chamber 201 is evacuated by the vacuum pump 246 while opening the APC valve 243. Thus, the $AlCl_3$ gas remaining within the process chamber 201, which has not reacted or which has contributed to the formation of the Al-containing layer, is removed from the interior of the process chamber 201. That is to say, the $AlCl_3$ gas remaining in a space where the wafer 200 having the Al-containing layer exists, which has not reacted or which has contributed to the formation of the Al-containing layer, is removed. At this time, the supply of the $N_2$ gas into the process chamber 201 is maintained while opening the valves 514, 524 and 534. The $N_2$ gas acts as a purge gas and, therefore, can enhance the effect of removing the $AlCl_3$ gas remaining within the process chamber 201, which has not reacted or which has contributed to the formation of the Al-containing layer, from the interior of the process chamber 201.

At this time, similar to the residual gas removal step performed after the $TiCl_4$ gas supply step, the gas remaining within the process chamber 201 may not be completely removed and the interior of the process chamber 201 may not be completely purged.

($C_3H_6$ Gas Supply Step)

Next, a $C_3H_6$ gas is supplied into the process chamber 201 by the same processing procedures and processing conditions as used at the aforementioned $C_3H_6$ gas supply step. At this time, only the $C_3H_6$ gas and the $N_2$ gas are supplied into the process chamber 201. The $C_3H_6$ gas makes substitution reaction with at least a portion of the Al-containing layer formed on the wafer 200 at the $AlCl_3$ gas supply step. During the substitution reaction, Al included in the Al-containing layer and C included in the $C_3H_6$ gas are bonded to each other. Most of Cl included in the Al-containing layer is bonded to H included in the $C_3H_6$ gas, whereby Cl is extracted or desorbed from the Al-containing layer. Thus, Cl is separated from the Al-containing layer as a reaction byproduct such as HCl or the like. Consequently, a layer including Al and C (hereinafter simply referred to as an AlC layer) is formed on the wafer 200. Since the AlC layer includes an Al—C bond, the AlC layer may be referred to as a layer including an Al—C bond and may be referred to as an AlC-containing layer.

(Residual Gas Removal System)

Subsequently, the $C_3H_6$ gas remaining within the process chamber 201, which has not reacted or which has contributed to the formation of the AlC layer, or the byproduct remaining within the process chamber 201 is removed from the interior of the process chamber 201 by the same procedures as used at the residual gas removal step performed after the $TiCl_4$ gas supply step. That is to say, the $C_3H_6$ gas remaining in a space where the wafer 200 having the AlC layer exists, which has not reacted or which has contributed to the formation of the AlC layer, or the byproduct remaining in the space where the wafer 200 having the AlC layer exists, is removed.

(Performing a Predetermined Number of Times)

An AlC film (second metal film) having a predetermined thickness (e.g., a thickness of 0.1 to 10 nm) is formed on the wafer 200 by performing, once or more (a predetermined number of times), a cycle which sequentially and time-divisionally performs the $AlCl_3$ gas supply step, the residual gas removal step, the $C_3H_6$ gas supply step and the residual gas removal step, namely by performing, $n_2$ cycles (where $n_2$ is an integer of 1 or more), one cycle including the $AlCl_3$ gas supply step, the residual gas removal step, the $C_3H_6$ gas supply step and the residual gas removal step. The aforementioned cycle may be repeated multiple times.

(Performing a Predetermined Number of Times)

A TiAlC film having a predetermined thickness (e.g., a thickness of 1.0 to 20 nm), which is configured as a laminated film formed by alternately laminating the TiC film and the AlC film at a nano level, is formed by time-divisionally performing, $n_3$ times (where $n_3$ is an integer of 1 or more), the step of forming the TiC film and the step of forming the AlC film. The aforementioned steps may be repeated multiple times.

(Purge and Return to Atmospheric Pressure)

After forming the TiAlC film having a predetermined film thickness, the valves 514, 524 and 534 are opened. The $N_2$ gas is supplied from the gas supply pipes 510, 520 and 530 into the process chamber 201 and is exhausted from the exhaust pipe 231. The $N_2$ gas acts as a purge gas. Thus, the interior of the process chamber 201 is purged by an inert gas. The gases or the reaction byproducts remaining within the process chamber 201 are removed from the interior of the process chamber 201 (purge). Thereafter, the internal atmosphere of the process chamber 201 is substituted with an inert gas (inert gas substitution), and the internal pressure of the process chamber 201 is returned to atmospheric pressure.

(Boat Unloading and Wafer Discharge)

The seal cap 219 is moved down by the boat elevator 115 to open the lower end of the manifold 209. The processed wafers 200 supported by the boat 217 are unloaded from the lower end of the manifold 209 outside of the process chamber 201 (boat unloading). The processed wafers 200 are discharged from the boat 217 (wafer discharge).

(3) Effects According to the Present Embodiment

According to the present embodiment, one or more effects mentioned below may be achieved.

In the present embodiment, the TiAlC film is formed as a nano laminate film by alternately laminating the TiC film and the AlC film at a nano level. It is therefore easy to independently control the concentrations of the respective elements, Ti, Al and C, included in the TiAlC film. For example, by adjusting the film composition ratio and the film thickness ratio of each of the TiC film and the AlC film, it becomes easy to adjust the composition ratio of the respective elements (Ti, Al and C) included in the TiAlC film to a predetermined ratio. In other words, it becomes easy to control (adjust, modulate or tune) a work function of a gate electrode configured by the obtained TiAlC film to a predetermined value. For example, in order to obtain a TiAlC film having a higher work function, the aforementioned sequence is performed under the processing conditions under which the concentration of C included in the TiAlC film decreases. In order to obtain a TiAlC film having a lower work function, the aforementioned sequence is performed under the processing conditions under which the concentration of C included in the TiAlC film increases.

In order to increase the concentration of C included in the TiAlC film, for example, the aforementioned substitution reaction is made saturated at the $C_3H_6$ gas supply step of at least one of the TiC film forming step and the AlC film forming step. For example, by making the aforementioned substitution reaction saturated at the $C_3H_6$ gas supply steps of the TiC film forming step and the AlC film forming step, it is possible to control the concentration of C included in the TiAlC film so as to become maximized. On the other hand, in order to reduce the concentration of C included in the TiAlC film, for example, the aforementioned substitution reaction is made unsaturated at the $C_3H_6$ gas supply step of at least one of the TiC film forming step and the AlC film forming step. For example, by making the aforementioned substitution reaction unsaturated at the $C_3H_6$ gas supply steps of the TiC film forming step and the AlC film forming step, it is possible to control the concentration of C included in the TiAlC film so as to become minimized. The saturation or unsaturation of the aforementioned substitution reaction at the $C_3H_6$ gas supply step can be realized by appropriately controlling the processing conditions at the respective steps within the aforementioned processing condition range.

In order to make the aforementioned substitution reaction unsaturated at the $C_3H_6$ gas supply step, it is preferred that the processing conditions at the $C_3H_6$ gas supply step are set to fall within the aforementioned processing condition range. However, if the processing conditions at the $C_3H_6$ gas supply step are set at the following processing conditions, it is easy to make the aforementioned substitution reaction unsaturated.

Wafer temperature: 200 to 400 degrees C., Internal pressure of the process chamber: 1 to 4,000 Pa, Partial pressure of the $C_3H_6$ gas: 0.01 to 3,960 Pa, Supply flow rate of the $C_3H_6$ gas: 100 to 10,000 sccm, Supply flow rate of the $N_2$ gas: 100 to 10,000 sccm, Supply time of the $C_3H_6$ gas: 0.1 to 60 seconds.

As described above, according to the present embodiment, it is possible to enhance the controllability of atomic concentrations of the respective elements (Ti, Al and C) included in the TiAlC film. This makes it possible to enhance the controllability of a work function of the TiAlC film.

When forming the TiAlC film, a precursor not containing C, for example, a halogen precursor such as a C-free metal halide or the like, is used as a Ti-containing precursor and an Al-containing precursor. An independent reaction gas differing from the Ti-containing precursor and the Al-containing precursor, for example, a hydrocarbon-based gas not containing a metal element, is used as a C-containing gas. This makes it possible to independently control the concentrations of Ti, Al and C. It is preferred that the Ti-containing precursor, the Al-containing precursor and the reaction gas do not contain N and Si. By using the Ti-containing precursor, the Al-containing precursor and the reaction gas which do not contain N and Si, it is possible to prevent undesired elements such as N, Si or the like from being introduced into the TiAlC as an impurity.

Since the TiAlC film is formed as a nano laminate film by alternately laminating the TiC film and the AlC film at a nano level, it is possible to adjust the film thickness of the TiC film and the AlC film and to cope with film thickness reduction. In this case, the film thickness of each of the TiC film and the AlC film may be set at, for example, 0.1 nm or more and 10 nm or less, preferably 0.1 nm or more and 5 nm or less, more preferably 0.1 nm or more and 1 nm or less. It is difficult to set the film thickness of each of the TiC film and the AlC film at a thickness of less than 0.1 nm. Furthermore, if the film thickness of one of the TiC film and the AlC film exceeds 10 nm, there may be a case where the finally-formed laminated film, namely the TiAlC film, becomes a film having inconsistent characteristics in the lamination direction, namely a film whose characteristics are made distinct in the lamination direction due to the mere lamination of the TiC film and the AlC film. By setting the thickness of each of the TiC film and the AlC film at 0.1 nm or more and 10 nm or less, preferably 0.1 nm or more and 5 nm or less, more preferably 0.1 nm or more and 1 nm or less, it is possible to have the finally-formed TiAlC film become a film having consistent characteristics in the lamination direction, namely a film in which the characteristics and properties of each of the TiC film and the AlC film are properly fused.

Furthermore, it is possible to control the concentration distributions of Ti, Al and C in the thickness direction of the TiAlC film. For example, it is possible to independently control the element composition ratios in the vicinity of an interface between the TiAlC film and the lower layer, in the interior of the TiAlC film and in the vicinity of an interface between the TiAlC film and the upper layer. That is to say, it is possible to give a gradation to the composition of each of the elements in the thickness direction of the TiAlC film.

The aforementioned effects are similarly achieved in the case where a C-free metal-containing gas other than the $TiCl_4$ gas or the $AlCl_3$ gas is used as the precursor gas or in the case where a C-containing gas other than the $C_3H_6$ gas is used as the reaction gas.

In the foregoing descriptions, there has been illustrated an example in which when forming the TiAlC film, the TiC film and the AlC film are formed in the named order. However, the present disclosure is not limited to this order. Even if the AlC film and the TiC film are formed in the named order, it is possible to achieve similar effects.

Second Embodiment of the Present Disclosure

In the first embodiment, there has been described an example in which the TiAlC film is formed as a nano laminate film by alternately laminating, at a nano level, the TiC film formed using the Ti-containing gas and the C-containing gas and the AlC film formed using the Al-containing gas and the C-containing gas. In the present embodiment, an example in which a TiAlC film is formed by supplying a Ti-containing gas, an Al-containing gas and a C-containing gas to the wafer 200 during one cycle will be described with reference to FIG. 5. Points differing from those of the first embodiment will be described below while omitting detailed descriptions on the same points as those of the first embodiment.

In a preferred sequence of the present embodiment, a metal film (e.g., a TiAlC film) including Ti, Al and C at a predetermined ratio is formed on a wafer 200 by performing, a predetermined number of times (n times), a cycle which sequentially and time-divisionally supplies a first precursor gas containing a first metal element (e.g., Ti) and not containing C (e.g., a $TiCl_4$ gas), a second precursor gas containing a second metal element (e.g., Al) differing from the first metal element and not containing C (e.g., an $AlCl_3$ gas), and a reaction gas containing C (e.g., a $C_3H_6$ gas) to the wafer 200.

The present embodiment differs from the first embodiment in that at a TiAlC film forming step, a cycle including a $TiCl_4$ gas supply step, a residual gas removal step, an $AlCl_3$ gas supply step, a residual gas removal step, a $C_3H_6$ gas supply step and a residual gas removal step is sequentially and time-divisionally performed n times (where n is an integer of 1 or more). The processing procedures and processing conditions used at the respective steps are substantially the same as those of the first embodiment.

In the foregoing descriptions regarding TiAlC film forming step, there has been illustrated an example in which the $TiCl_4$ gas supply step is performed earlier than the $AlCl_3$ gas supply step. However, the present disclosure is not limited thereto. The AlCl$_3$ gas supply step may be performed earlier than the TiCl$_4$ gas supply step.

Figure 5:
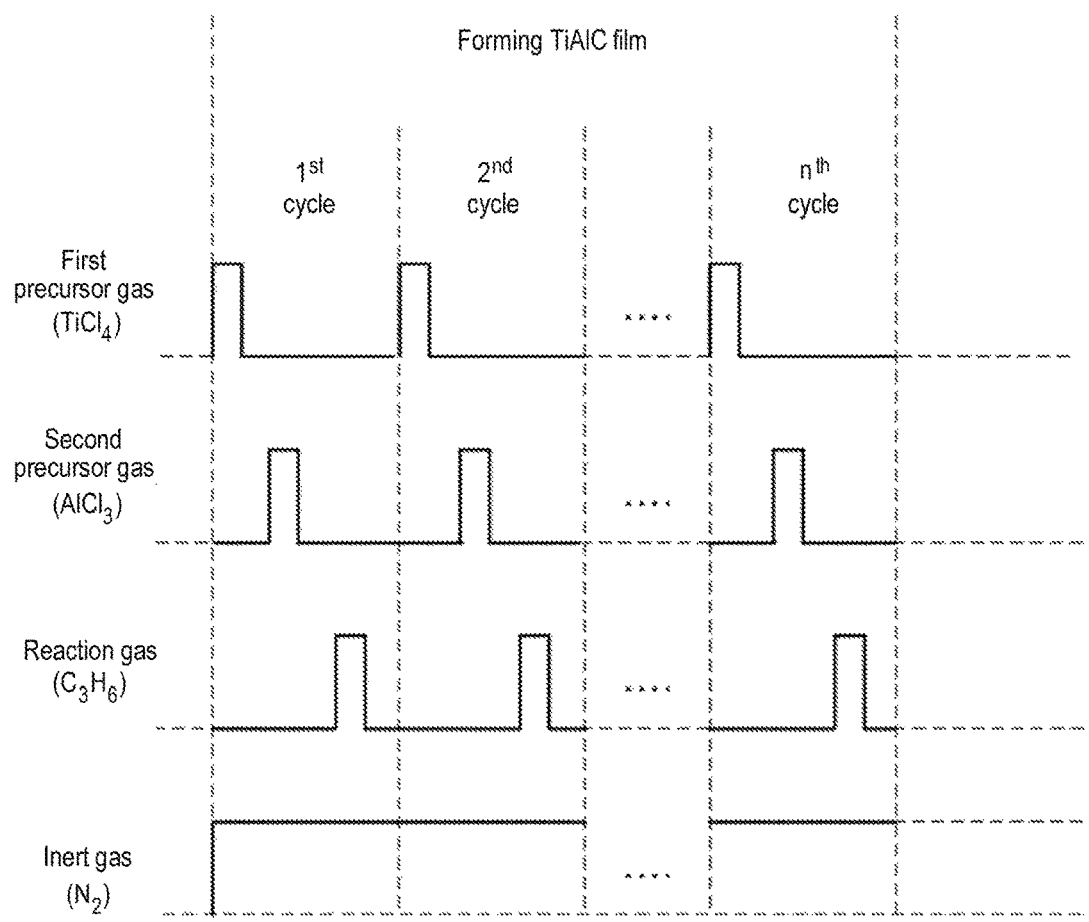
FIG. 5 is a view illustrating a sequence according to a second embodiment of the present disclosure.

The film forming sequence according to the present embodiment is not limited to the form illustrated in FIG. 5 but may be modified as in the modifications which will be described below.

(Modification 1 of the Second Embodiment)

Figure 6:
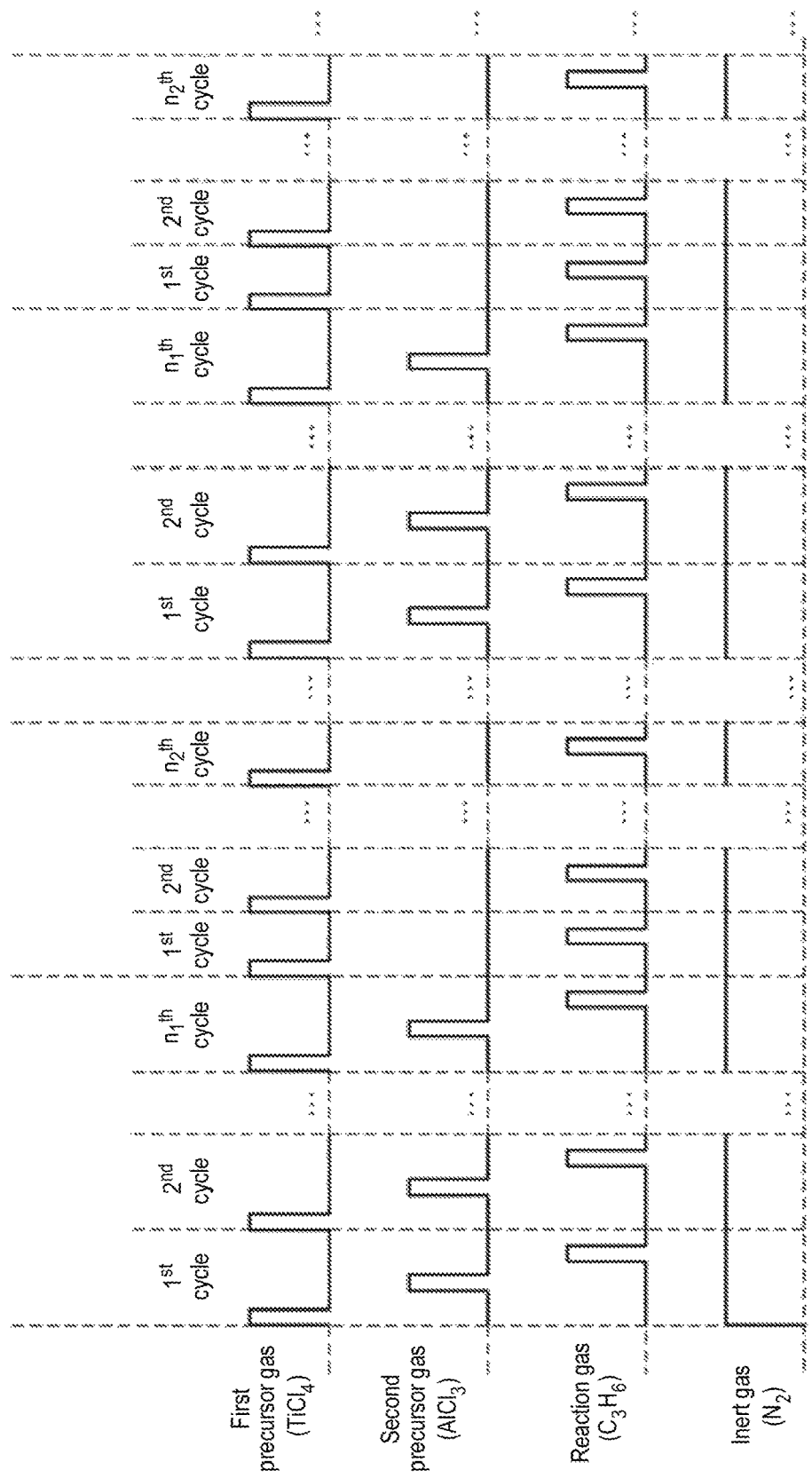
FIG. 6 is a view illustrating modification 1 of the sequence according to the second embodiment of the present disclosure.

In the respective cycles, all the TiCl$_4$ gas supply step, the AlCl$_3$ gas supply step and the C$_3$H$_6$ gas supply step may not be necessarily performed every time. For example, as illustrated in FIG. 6, a TiAlC film may be formed on the wafer 200 by sequentially and time-divisionally performing, $n_1$ cycles (where $n_1$ is an integer of 1 or more), one cycle including a TiCl$_4$ gas supply step, a residual gas removal step, an AlCl$_3$ gas supply step, a residual gas removal step, a C$_3$H$_6$ gas supply step and a residual gas removal step, then sequentially and time-divisionally performing, $n_2$ cycles (where $n_2$ is an integer of 1 or more), one cycle including the TiCl$_4$ gas supply step, the residual gas removal step, the C$_3$H$_6$ gas supply step and the residual gas removal step, and repeating the above cycles $n_3$ times (where $n_3$ is an integer of 1 or more).

According to this modification, it is easy to adjust each of the concentrations of Ti, Al and C included in the TiAlC film formed on the wafer 200 to a predetermined concentration. That is to say, it is possible to enhance the controllability of atomic concentrations of the respective elements (Ti, Al and C) included in the TiAlC film. This makes it possible to enhance the controllability of a work function of the TiAlC film.

(Modification 2 of the Second Embodiment)

Figure 7:
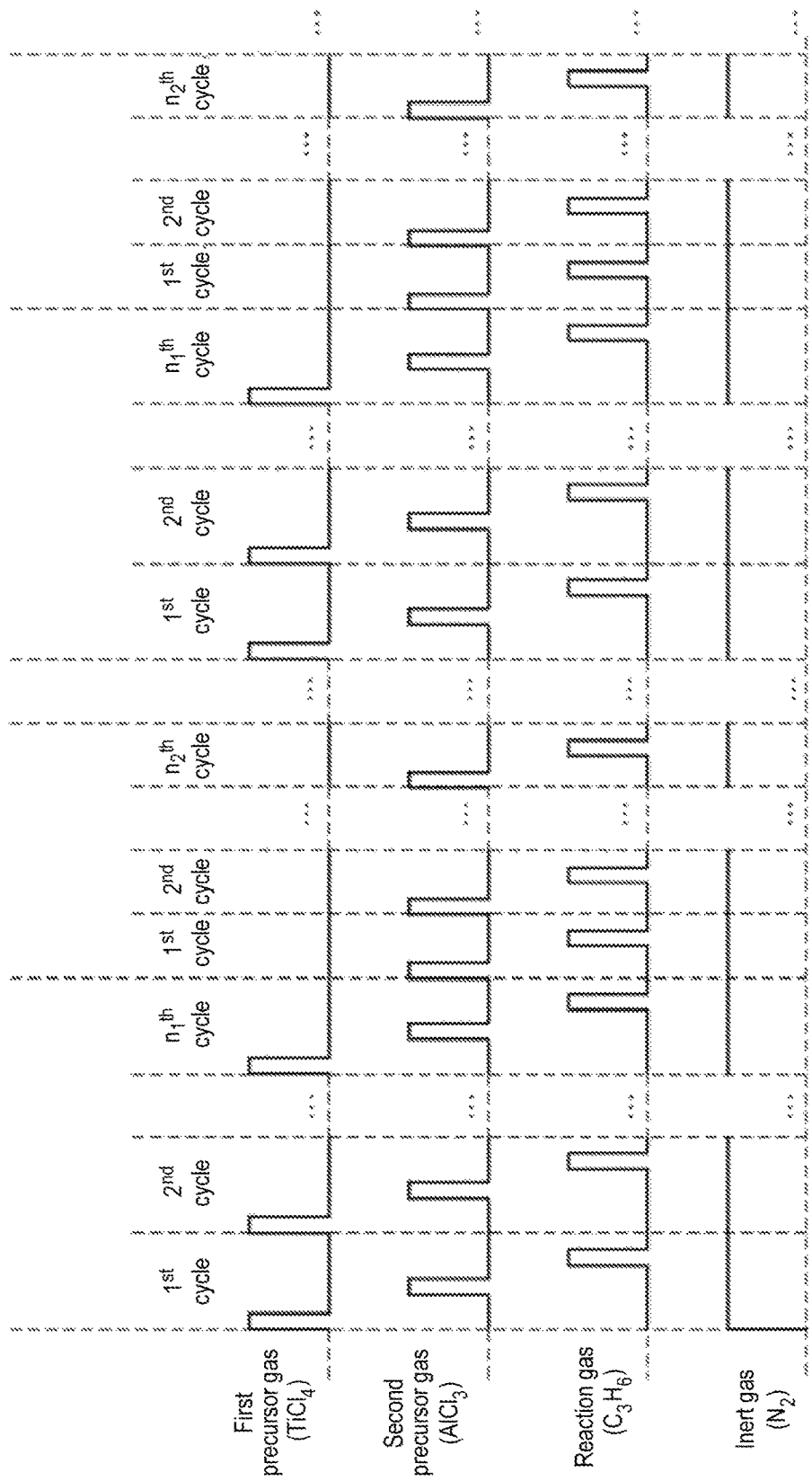
FIG. 7 is a view illustrating modification 2 of the sequence according to the second embodiment of the present disclosure.

As illustrated in FIG. 7, a TiAlC film may be formed on the wafer 200 by sequentially and time-divisionally performing, $n_1$ cycles (where $n_1$ is an integer of 1 or more), one cycle including a TiCl$_4$ gas supply step, a residual gas removal step, an AlCl$_3$ gas supply step, a residual gas removal step, a C$_3$H$_6$ gas supply step and a residual gas removal step, then sequentially and time-divisionally performing, $n_2$ cycles (where $n_2$ is an integer of 1 or more), one cycle including the AlCl$_3$ gas supply step, the residual gas removal step, the C$_3$H$_6$ gas supply step and the residual gas removal step, and repeating the above cycles, $n_3$ cycles (where $n_3$ is an integer of 1 or more).

According to this modification, it is easy to adjust each of the concentrations of Ti, Al and C included in the TiAlC film formed on the wafer 200 to a predetermined concentration. That is to say, it is possible to enhance the controllability of atomic concentrations of the respective elements (Ti, Al and C) included in the TiAlC film. This makes it possible to enhance the controllability of a work function of the TiAlC film.

(Modification 3 of the Second Embodiment)

Figure 8:
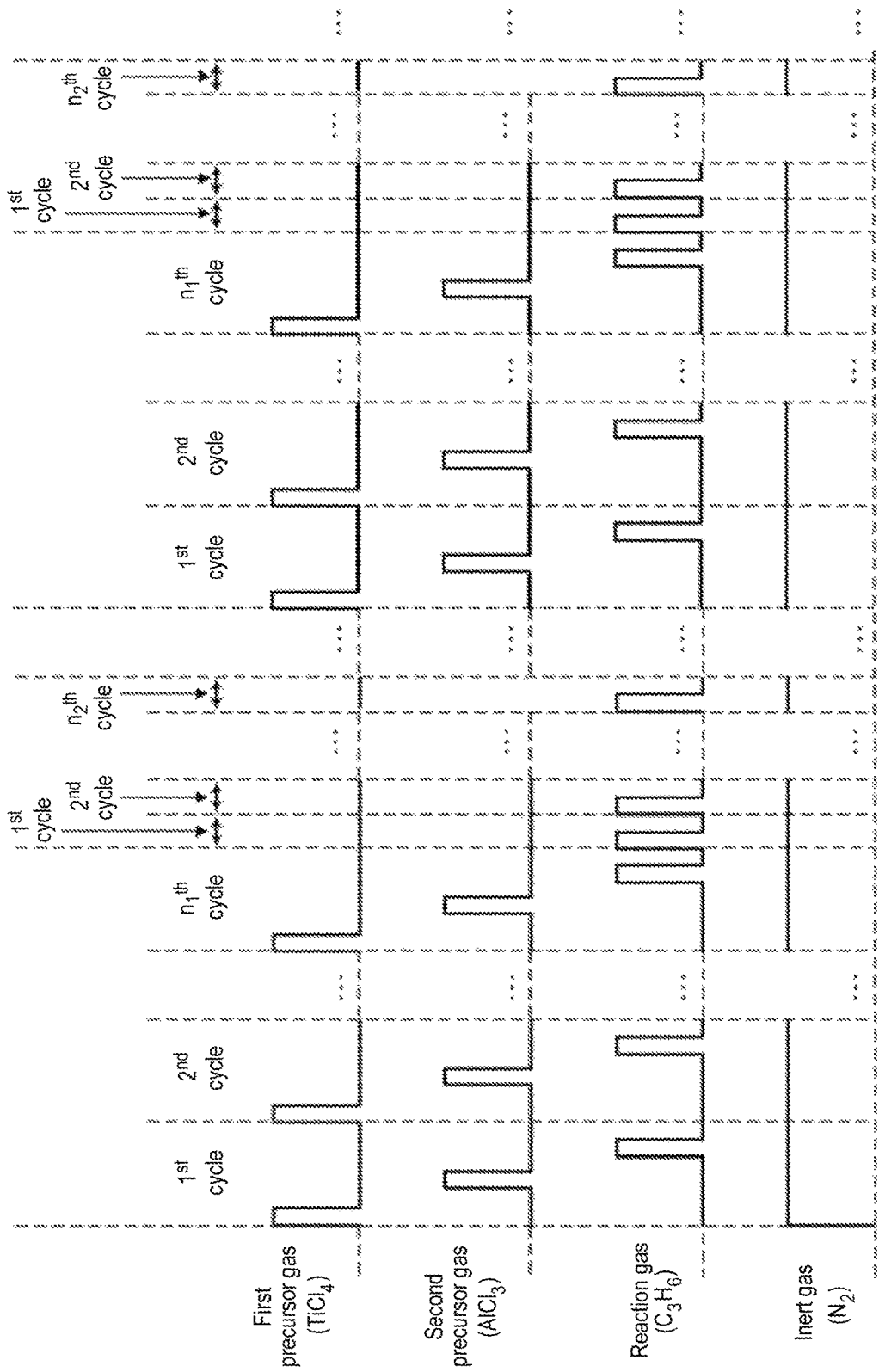
FIG. 8 is a view illustrating modification 3 of the sequence according to the second embodiment of the present disclosure.

As illustrated in FIG. 8, a TiAlC film may be formed on the wafer 200 by sequentially and time-divisionally performing, $n_1$ cycles (where $n_1$ is an integer of 1 or more), one cycle including a TiCl$_4$ gas supply step, a residual gas removal step, an AlCl$_3$ gas supply step, a residual gas removal step, a C$_3$H$_6$ gas supply step and a residual gas removal step, then sequentially and time-divisionally performing, $n_2$ cycles (where $n_2$ is an integer of 1 or more), one cycle including the C$_3$H$_6$ gas supply step and the residual gas removal step, and repeating the above cycles $n_3$ times (where $n_3$ is an integer of 1 or more).

According to this modification, it is easy to adjust each of the concentrations of Ti, Al and C included in the TiAlC film formed on the wafer 200 to a predetermined concentration. In particular, as compared with modifications 1 and 2 of the second embodiment, it is easier to independently control the concentration of C. That is to say, it is possible to enhance the controllability of an atomic concentration of C among the respective elements (Ti, Al and C) included in the TiAlC film. This makes it possible to enhance the controllability of a work function of the TiAlC film.

Third Embodiment of the Present Disclosure

Figure 9:
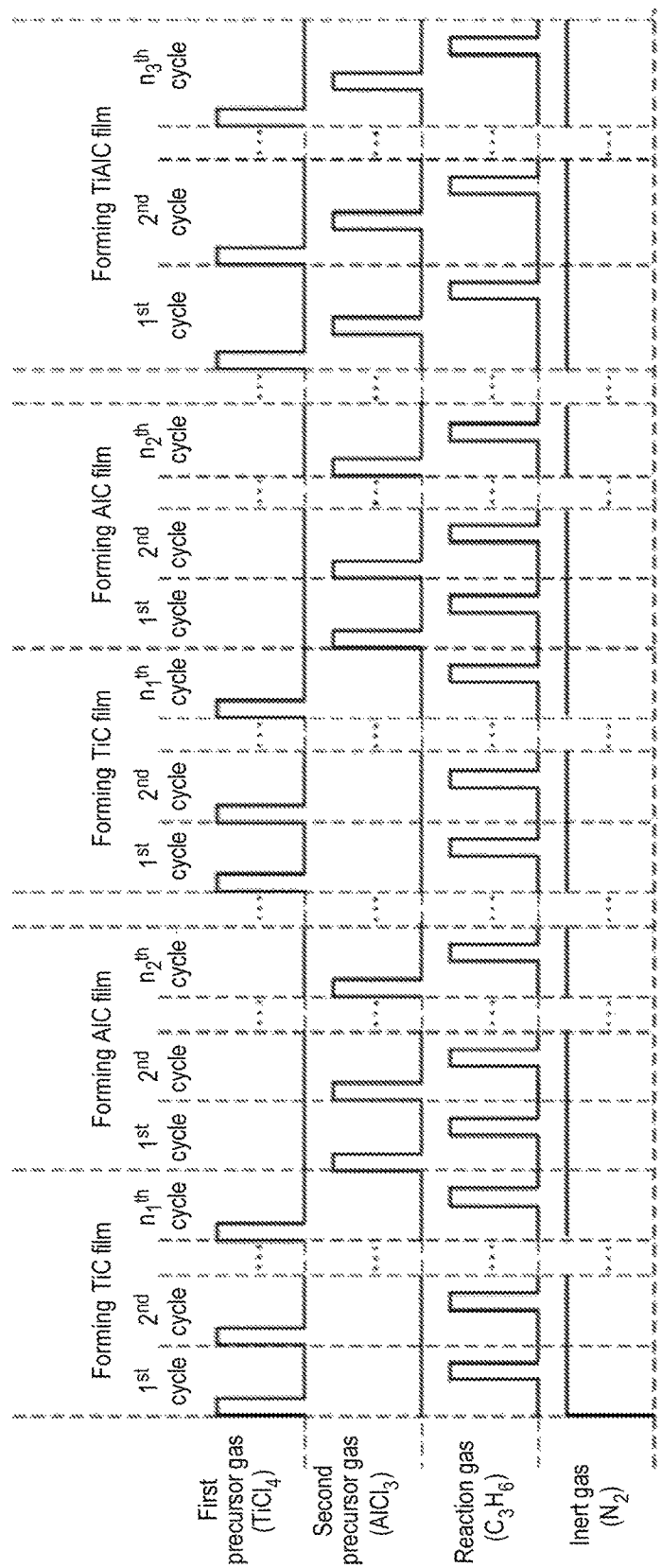
FIG. 9 is a view illustrating a sequence according to a third embodiment of the present disclosure.

As a third embodiment, a combination of the first embodiment and the second embodiment will be described with reference to FIG. 9. Points differing from those of the first embodiment and the second embodiment will be described below while omitting detailed descriptions on the same points as those of the first embodiment and the second embodiment.

In one sequence of the present embodiment, a metal film (e.g., a TiAlC film) including Ti, Al and C at a predetermined ratio is formed on a wafer 200 by performing:

a step of forming a metal film (e.g., a TiAlC film) including Ti, Al and C at a predetermined ratio on the wafer 200 by performing, a predetermined number of times ($n_3$ times), a step of forming a TiC film by performing, a predetermined number of times ($n_1$ cycles), one cycle including a process of time-divisionally supplying a first precursor gas (e.g., a TiCl$_4$ gas) containing a first metal element (e.g., Ti) and a reaction gas (e.g., a C$_3$H$_6$ gas) containing C to the wafer 200 to form a layer (e.g., a TiC layer) including the first metal element (e.g., Ti) and C, and a step of forming an AlC film by performing, a predetermined number of times ($n_2$ cycles), one cycle including a process of time-divisionally supplying a second precursor gas (e.g., an AlCl$_3$ gas) containing a second metal element (e.g., Al) differing from the first metal element and a reaction gas (e.g., a C$_3$H$_6$ gas) containing C to the wafer 200 to form a layer (e.g., an AlC layer) including the second metal element (e.g., Al) and C; and a step of forming a metal film (e.g., a TiAlC film) including Ti, Al and C at a predetermined ratio on the metal film by time-divisionally supplying, a predetermined number of times ($n_4$ times), the TiCl$_4$ gas, the AlCl$_3$ gas and C$_3$H$_6$ gas to the wafer 200.

That is to say, a TiAlC film having a predetermined film thickness is formed on the wafer 200 using the sequence of the first embodiment and, then, a TiAlC film having a predetermined film thickness is formed on the TiAlC film using the sequence of the second embodiment. The processing procedures and processing conditions used at the respective steps are substantially the same as those of the first embodiment and the second embodiment.

Furthermore, the combination of the sequence of the first embodiment and the sequence of the second embodiment may be performed once. The sequence of the first embodiment may be further performed after the sequence of the second embodiment. The sequence of the first embodiment and the sequence of the second embodiment may be alternately repeated twice or more. Moreover, the sequence of the second embodiment may be first performed and, then, the sequence of the first embodiment may be performed. Even in the present embodiment, it is possible to obtain the effects achieved by the sequences of the first embodiment and the second embodiment.

Fourth Embodiment of the Present Disclosure

Figure 10:
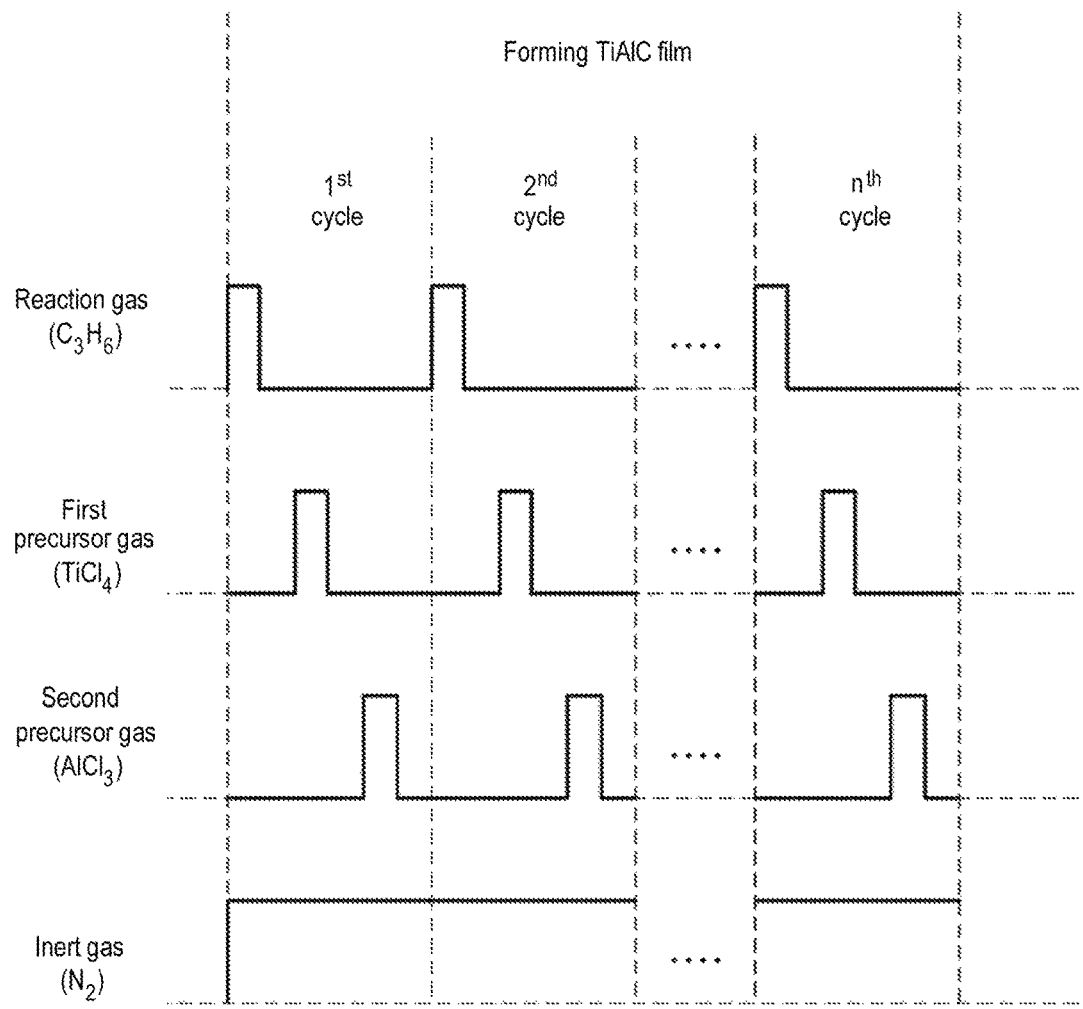
FIG. 10 is a view illustrating a sequence according to a fourth embodiment of the present disclosure.

A fourth embodiment will be described with reference to FIG. 10. In the second embodiment, there has been described a sequence in which at the TiAlC film forming step, a cycle including the TiCl$_4$ gas supply step, the residual gas removal step, the AlCl$_3$ gas supply step, the residual gas removal step, the C$_3$H$_6$ gas supply step and the residual gas removal step is sequentially and time-divisionally performed n times (where n is an integer of 1 or more). However, the present embodiment differs from the second embodiment in that the C$_3$H$_6$ gas supply step, the residual gas removal step, the TiCl$_4$ gas supply step, the residual gas removal step, the AlCl$_3$ gas supply step and the residual gas removal step are time-divisionally performed n times (where n is an integer of 1 or more) in the named order. That is to say, in the second embodiment, the precursor gas (the TiCl$_4$ gas or the AlCl$_3$ gas) is first supplied onto the wafer 200 and, then, the reaction gas (the C$_3$H$_6$ gas) is supplied onto the wafer 200. However, in the present embodiment, the reaction gas is first supplied onto the wafer 200 and, then, the precursor gas is supplied onto the wafer 200.

In one sequence of the present embodiment, a metal film (e.g., a TiAlC film) including Ti, Al and C at a predetermined ratio is formed on a wafer 200 by performing, a predetermined number of times (n times), a cycle which sequentially and time-divisionally supplies a reaction gas (e.g., a C$_3$H$_6$ gas) containing C, a first precursor gas (e.g., a TiCl$_4$ gas) containing a first metal element (e.g., Ti), and a second precursor gas (e.g., an AlCl$_3$ gas) containing a second metal element (e.g., Al) differing from the first metal element, to the wafer 200.

Furthermore, the processing conditions may be the same as the processing conditions of the second embodiment. However, in the present embodiment, descriptions will be made on an example in which films are formed by setting the temperature of the wafer 200 at a temperature lower than the temperature of the wafer 200 used in the second embodiment, for example, a temperature falling within a range of 200 to 400 degrees C. Hereinafter, points differing from those of the second embodiment will be described while omitting detailed descriptions on the same points as those of the second embodiment.

If the C$_3$H$_6$ gas is supplied into the process chamber 201 at the C$_3$H$_6$ gas supply step, a substitution reaction occurs between the surface of the wafer 200 (the underlying film of the surface of the wafer 200) and the C$_3$H$_6$ gas, whereby C is adsorbed onto the wafer 200 to form a C-containing layer. The C-containing layer may be a C layer, an adsorption layer of C$_3$H$_6$, or a layer including the C layer and adsorption layer of C$_3$H$_6$. The C layer includes not only a continuous layer composed of C but also a discontinuous layer. The adsorption layer of C$_3$H$_6$ includes not only a continuous adsorption layer of C$_3$H$_6$ molecules but also a discontinuous adsorption layer thereof. The C$_3$H$_6$ molecules that constitute the adsorption layer of C$_3$H$_6$ include molecules in which bonds of C and H are partially broken. That is to say, the adsorption layer of C$_3$H$_6$ includes a physical adsorption layer of C$_3$H$_6$ or a chemisorption layer thereof. However, under the conditions of the present embodiment, chemisorption of C$_3$H$_6$ onto the wafer 200 is more predominant than physical adsorption of C$_3$H$_6$ onto the wafer 200.

After the C$_3$H$_6$ gas supply step, the residual gas removal step is performed and the TiCl$_4$ gas supply step is performed. If the TiCl$_4$ gas is supplied into the process chamber 201 at the TiCl$_4$ gas supply step, TiCl$_4$ is chemisorbed to a portion of the C-containing layer formed on the wafer 200. Specifically, C included in the C-containing layer is bonded to Ti included in the TiCl$_4$ gas. At this time, H included in the C-containing layer is bonded to Cl included in the TiCl$_4$ gas, whereby H is extracted or desorbed from the C-containing layer. Thus, H is separated from the C-containing layer as a reaction byproduct such as HCl or the like. Consequently, a layer including Ti and C (hereinafter simply referred to as a TiC layer) is formed on the wafer 200.

At this time, the processing conditions such as the supply time of the TiCl$_4$ gas, the supply flow rate of the TiCl$_4$ gas and the like are set (controlled) at a predetermined value falling within the aforementioned processing condition range so that some of C included in the C-containing layer and Ti included in the TiCl$_4$ gas are bonded to each other and so that the TiC layer formed by chemisorption of TiCl$_4$ becomes discontinuous. That is to say, chemisorption of TiCl$_4$ is made unsaturated and a TiC layer having a thickness of less than one molecular layer (atomic layer) is formed while leaving a portion of an adsorption site of the C-containing layer on the wafer 200. For example, a TiC layer having a thickness of about 0.5 molecular layer, namely about one-half molecular layer, is formed on the wafer 200. When a state in which 100% of the adsorption site of the C-containing layer is filled, namely a state in which TiCl$_4$ can be no longer chemisorbed to the C-containing layer, is referred to as one molecular layer, the 0.5 molecular layer means that 50% of the adsorption site of the C-containing layer is filled. Furthermore, due to the generation of steric hindrance in the respective atoms and between the respective molecules, the percentage of the adsorption site of the C-containing layer to which TiCl$_4$ can be actually chemisorbed becomes smaller than when the steric hindrance is not generated. In view of this, when the percentage of the adsorption site of the C-containing layer to which TiCl$_4$ can be actually chemisorbed is assumed to be 100%, the state in which the entirety of the adsorption site of the C-containing layer is filled is regarded as a state in which 100% of the adsorption site of the C-containing layer is filled.

After the TiCl$_4$ gas supply step, the residual gas removal step is performed and the AlCl$_3$ gas supply step is performed. If the AlCl$_3$ gas is supplied into the process chamber 201 at the AlCl$_3$ gas supply step, the AlCl$_3$ gas is chemisorbed to the TiC layer formed on the wafer 200. Specifically, C included in the TiC layer and not bonded to Ti is bonded to Al included in the AlCl$_3$ gas. That is to say, the AlCl$_3$ gas is chemisorbed to the adsorption site of the C-containing layer left on the wafer 200 at the TiCl$_4$ gas supply step. Thus, a TiAlC layer is formed.

In the foregoing descriptions, there has been illustrated an example in which at the TiAlC film forming step, the TiCl$_4$ gas supply step is performed earlier than the AlCl$_3$ gas supply step. However, the present disclosure is not limited thereto. The AlCl$_3$ gas supply step may be performed earlier than the TiCl$_4$ gas supply step.

Furthermore, in the foregoing descriptions, there has been illustrated an example in which at the TiCl$_4$ gas supply step, the TiC layer having a thickness of about 0.5 molecular layer is formed on the wafer 200. However, the present disclosure is not limited thereto. The percentage of the adsorption site of the C-containing layer to which Ti is adsorbed may be appropriately changed and decided depending on the value of the composition ratio of Ti, Al and C (i.e., the work function) required in the obtained TiAlC film.

In addition, the sequence of the present embodiment may be modified as in modifications 1 to 3 of the second embodiment. Even in the present embodiment, it is possible to achieve the same effects as those of the sequences of the second embodiment and the modifications thereof illustrated in FIGS. 5 to 8.

OTHER EMBODIMENTS

The present disclosure is not limited to the aforementioned embodiments but may be differently modified without departing from the spirit thereof.

For example, as described above, by causing a halide containing a metal element to react with a hydrocarbon-based gas, a metal carbide film may be formed on a substrate from which a conductor film, an insulating film, or a conductor pattern isolated by the insulating film is exposed.

Furthermore, for example, as described above, by causing a halide containing a first metal element and a halide containing a second metal element to react with a hydrocarbon-based gas, an alloy film (alloy carbide film) as a metal carbide film may be formed on a substrate from which a conductor film, an insulating film, or a conductor pattern isolated by the insulating film is exposed. A film including plural kinds of metal elements, like the TiAlC film, may be referred to as an alloy film (alloy carbide film).

Furthermore, as described above, the element composition ratio in the thickness direction of the formed film may be controlled (adjusted, modulated or tuned) by combining a process (hereinafter also referred to as a laminate sequence) of forming a film by laminating a first metal carbide film and a second metal carbide film and a sequence (hereinafter also referred to as a multiple-element supply sequence) of supplying a halide containing a first metal element, a halide containing a second metal element and a hydrocarbon-based gas.

Furthermore, the work function of the formed film may be controlled (adjusted, modulated or tuned) by combining a laminate sequence using a first metal carbide film and a second metal carbide film and a multiple-element supply sequence of supplying a halide containing a first metal element, a halide containing a second metal element and a hydrocarbon-based gas.

In the aforementioned embodiments, there has been described an example in which the TiAlC film as a metal carbide film is formed using Ti and Al as the first metal element and the second metal element. However, the present disclosure is not limited to the aforementioned embodiments. The present disclosure may be suitably applied to a case of forming a metal carbide film including elements other than Ti, Al and C, or a metal carbide film including at least one kind of other metal element, for example, a transition metal element such as hafnium (Hf), zirconium (Zr), tantalum (Ta), molybdenum (Mo), tungsten (W) or the like.

Examples of an applicable metal carbide film may include a metal carbide-based film, a metal carbonitride-based film and a metal oxycarbide-based film, such as a TiAlCN film, a TiAlOC film, a TiHfC film, a TiHfCN film, a TiHfOC film, a TiZrC film, a TiZrCN film, a TiZrOC film, a TaAlC film, a TaAlCN film, a TaAlOC film, a TaHfC film, a TaHfCN film, a TaHfOC film, a TaZrC film, a TaZrCN film, a TaZrOC film, a MoAlC film, a MoAlCN film, a MoAlOC film, a MoHfC film, a MoHfCN film, a MoHfOC film, a MoZrC film, a MoZrCN film, a MoZrOC film, a WAlC film, a WAlCN film, a WAlOC film, a WHfC film, a WHfCN film, a WHfOC film, a WZrC film, a WZrCN film, a WZrOC film, and the like. Furthermore, it may be considered that the metal carbonitride-based film and the metal oxycarbide-based film are included in the metal carbide-based film.

Examples of the C-free precursor may include a halogen precursor (also referred to as a halide) containing a halogen group, such as $TiCl_4$, $AlCl_3$ or the like. Examples of the halogen group may include a chloro group, a fluoro group, a bromo group and an iodine group. That is to say, the halogen group includes a halogen element such as chlorine (CO, fluorine (F), bromine (Br), iodine (I), or the like.

Furthermore, in the case of forming the aforementioned metal carbide film, in addition to $TiCl_4$ and $AlCl_3$, it may be possible to use aluminum trifluoride ($AlF_3$), titanium tetrafluoride ($TiF_4$), hafnium tetrachloride ($HfCl_4$), hafnium tetrafluoride ($HfF_4$), zirconium tetrachloride ($ZrCl_4$), zirconium tetrafluoride ($ZrF_4$), tantalum pentachloride ($TaCl_5$), tantalum pentafluoride ($TaF_5$), molybdenum pentachloride ($MoCl_5$), molybdenum pentafluoride ($MoF_5$), tungsten hexachloride ($WCl_6$), tungsten hexafluoride ($WF_6$), or the like.

As the C-containing gas, in addition to the $C_3H_6$ gas, it may be possible to use a hydrocarbon-based gas such as an ethylene ($C_2H_4$) gas, a hexane ($C_6H_{14}$) gas, an ethanol ($C_2H_6O$) gas or the like. In the foregoing descriptions, there has been illustrated an example in which only the $C_3H_6$ gas is used as the C-containing gas. However, the present disclosure is not limited thereto. For example, it may be possible to use C-containing gases having mutually different chemical structures (molecular structures, element compositions, etc.), such as a $C_3H_6$ gas and a $C_2H_4$ gas. That is to say, it may be possible to use an appropriate combination of different kinds of hydrocarbon-based gases. For example, a $C_3H_6$ gas may be used when forming a TiC film as a first metal film and a $C_2H_4$ gas may be used when forming an AlC film as a second metal film. In this way, by using different kinds of hydrocarbon-based gases at the TiC film forming step and the AlC film forming step, it is possible to finely adjust the C concentration in the finally formed TiAlC film. This makes it possible to finely adjust the work function of the TiAlC film.

As the inert gas, in addition to the $N_2$ gas, it may be possible to use a rare gas such as an argon (Ar) gas, a helium (He) gas, a neon (Ne) gas, a xenon (Xe) gas or the like.

A metal film (e.g., a TiAlC film) including Ti, Al and C at a predetermined ration may be formed on a wafer 200 by performing, $n_2$ times (where $n_2$ is an integer of 1 or more), one cycle which includes a step of performing, $n_1$ times (where $n_1$ is an integer of 1 or more), a cycle of time-divisionally supplying a first precursor gas (e.g., a $TiCl_4$ gas) containing a first metal element (e.g., Ti) and a second precursor gas (e.g., an $AlCl_3$ gas) containing a second metal element (e.g., Al) differing from the first metal element to the wafer 200, and a step of supplying a reaction gas (e.g., a $C_3H_6$ gas) containing C to the wafer 200. In this case, it is easy to reduce the C concentration particularly in the metal film. That is to say, it is easy to add a small amount of C to the metal film. At this time, the processing conditions may be the same as, for example, the processing conditions of the aforementioned embodiments.

A metal film (e.g., a TiAlC film) including Ti, Al and C at a predetermined ratio may be formed on a wafer 200 by performing, $n_2$ times (where $n_2$ is an integer of 1 or more), one cycle which includes a step of performing, $n_1$ times (where $n_1$ is an integer of 1 or more), a cycle of time-divisionally supplying a first precursor gas (e.g., a $TiCl_4$ gas) containing a first metal element (e.g., Ti) and a reaction gas (e.g., a $C_3H_6$ gas) containing C to the wafer 200, and a step of supplying a second precursor gas (e.g., an $AlCl_3$ gas) containing a second metal element (e.g., Al) differing from the first metal element to the wafer 200. In this case, it is easy to reduce the Al concentration particularly in the metal film. That is to say, it is easy to add a small amount of Al to the metal film. Furthermore, in the aforementioned sequence, if the $AlCl_3$ gas is used as the first precursor gas by selecting Al as the first metal element and if the $TiCl_4$ gas is used as the second precursor gas by selecting Ti as the second metal element, it is easy to reduce the Ti concentration particularly in the metal film. That is to say, it is easy to add a small amount of Ti to the metal film. At this time, the processing conditions may be the same as, for example, the processing conditions of the aforementioned embodiments.

The embodiments, modifications and applications described above may be used by appropriately combining them. At this time, the processing conditions may be the same as, for example, the processing conditions of the aforementioned embodiments.

Process recipes (e.g., programs in which processing procedures and processing conditions are written) used in forming these various kinds of thin films may be prepared individually (in a plural number) according to the contents of a substrate processing process (e.g., the kind, composition ratio, film quality, film thickness, processing procedure and processing condition of the thin film to be formed). In addition, at the start of the substrate processing, an appropriate process recipe may be properly selected from a plurality of process recipes according to the substrate processing contents. Specifically, the plurality of process recipes individually prepared according to the substrate processing contents may be stored (or installed) in advance in the memory device 121c of the substrate processing device via a telecommunication line or a recording medium (the external memory device 123) storing the process recipes. Moreover, at the start of the substrate processing, the CPU 121a of the substrate processing device may properly select an appropriate process recipe from the plurality of the process recipes stored in the memory device 121c according to the substrate processing contents. This configuration enables a single substrate processing device to form thin films of different kinds, composition ratios, film qualities and film thicknesses for general purposes and with enhanced reproducibility. In addition, this configuration makes it possible to reduce an operator's operation burden (a burden borne by an operator when inputting processing procedures and processing conditions) and to quickly start the substrate processing while avoiding an operation error.

The process recipes mentioned above are not limited to newly-prepared ones but may be realized by, for example, modifying the process recipes of the existing substrate processing device. When modifying the process recipes, the modified recipes may be installed in the existing substrate processing device via a telecommunication line or a recording medium storing the process recipes according to the present disclosure. In addition, the process recipes of the existing substrate processing device may be modified to the process recipes according to the present disclosure by operating the input/output device of the existing substrate processing device.

In the aforementioned embodiments, there has been described an example in which films are formed using a batch-type vertical substrate processing device configured to process a plurality of substrates at a time, namely a processing furnace having a structure in which nozzles for supplying process gases are vertically installed within a single reaction tube and in which an exhaust port is formed in the lower portion of the reaction tube. However, the present disclosure may be applied to a case where films are formed using a processing furnace having another structure. For example, the present disclosure may be applied to a case where films are formed using a processing furnace having a structure which includes two reaction tubes with concentric cross sections (where the outer reaction tube will be called an outer tube and the inner reaction tube will be called an inner tube) and in which process gases flow from nozzles vertically installed within the inner tube toward an exhaust port opened in a sidewall of the outer tube in a position (line symmetry position) opposing the nozzles across the substrates. Furthermore, the process gases may not be supplied from the nozzles vertically installed within the inner tube but may be supplied from gas supply holes opened in a sidewall of the inner tube. In this case, the exhaust port opened in the outer tube may be formed along the existing height of a plurality of substrates stacked and accommodated within a process chamber. The shape of the exhaust port may be a hole shape or a slit shape.

In the aforementioned embodiments, there has been described an example in which films are formed using a batch-type vertical substrate processing device configured to process a plurality of substrates at a time. The present disclosure is not limited thereto but may be appropriately applied to, for example, a case where films are formed using a single-substrate-type substrate processing device configured to process a single substrate or several substrates at a time. In addition, in the aforementioned embodiments, there has been described an example in which films are formed using a substrate processing device provided with a hot-wall-type processing furnace. The present disclosure is not limited thereto but may be appropriately applied to a case where films are formed using a substrate processing device provided with a cold-wall-type processing furnace. In these cases, the processing conditions may be the same as, for example, the processing conditions of the aforementioned embodiments.

Figure 11:
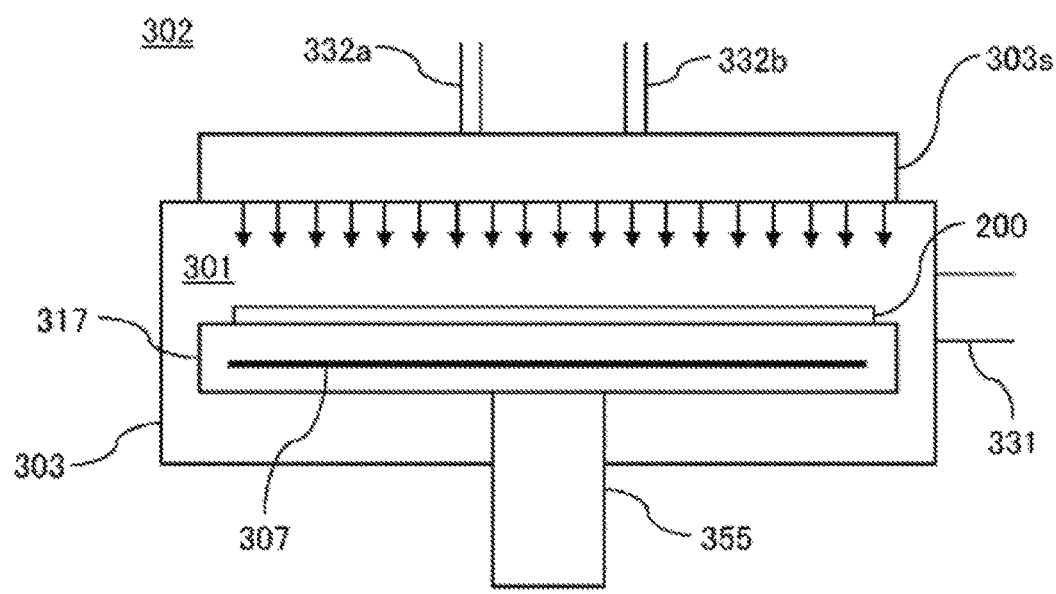
FIG. 11 is a schematic configuration view of a processing furnace of a substrate processing device suitably used in another embodiment of the present disclosure, in which a portion of the processing furnace is shown in a vertical cross section.

For example, the present disclosure may be suitably applied to a case where a film is formed using a substrate processing device provided with a processing furnace 302 illustrated in FIG. 11. The processing furnace 302 includes a process vessel 303 which defines a process chamber 301, a shower head 303s configured to supply gases into the process chamber 301 in a shower-like manner, a support table 317 configured to horizontally support one or more wafers 200, a rotary shaft 355 configured to support the support table 317 from below, and a heater 307 installed in the support table 317. A gas supply port 332a configured to supply the aforementioned precursor gas and a gas supply port 332b configured to supply the aforementioned reaction gas are connected to inlets (gas introduction holes) of the shower head 303s. A precursor gas supply system similar to the precursor gas supply system of the aforementioned embodiments is connected to the gas supply port 332a. A reaction gas supply system similar to the reaction gas supply system of the aforementioned embodiments is connected to the gas supply port 332b. A gas distribution plate configured to supply gases into the process chamber 301 in a shower-like manner is installed in outlets (gas discharge holes) of the shower head 303s. An exhaust port 331 configured to evacuate the interior of the process chamber 301 is installed in the process vessel 303. An exhaust system similar to the exhaust system of the aforementioned embodiments is connected to the exhaust port 331.

Figure 12:
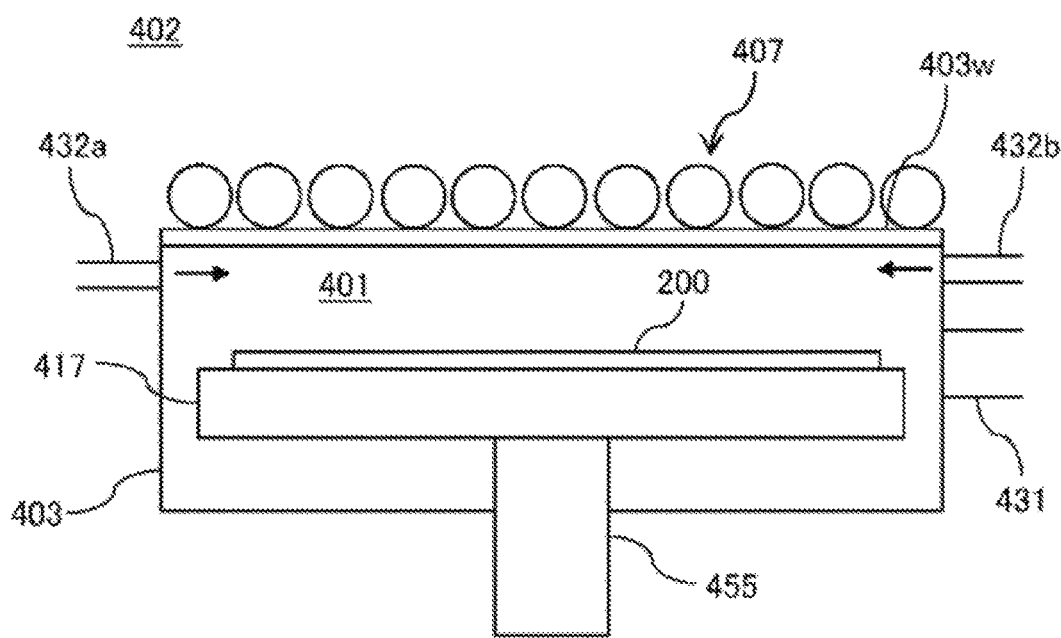
FIG. 12 is a schematic configuration view of a processing furnace of a substrate processing device suitably used in a further embodiment of the present disclosure, in which a portion of the processing furnace is shown in a vertical cross section.

In addition, for example, the present disclosure may be suitably applied to a case where a film is formed using a substrate processing device provided with a processing furnace 402 illustrated in FIG. 12. The processing furnace 402 includes a process vessel 403 which defines a process chamber 401, a support table 417 configured to horizontally support one or more wafers 200, a rotary shaft 455 configured to support the support table 417 from below, a lamp heater 407 configured to irradiate light toward the wafers 200 disposed within the process vessel 403, and a quartz window 403w which transmits the light irradiated from the lamp heater 407. A gas supply port 432a configured to supply the aforementioned precursor gas and a gas supply port 432b configured to supply the aforementioned reaction gas are connected to the process vessel 403. A precursor gas supply system similar to the precursor gas supply system of the aforementioned embodiments is connected to the gas supply port 432a. A reaction gas supply system similar to the reaction gas supply system of the aforementioned embodiments is connected to the gas supply port 432b. An exhaust port 431 configured to evacuate the interior of the process chamber 401 is installed in the process vessel 403. An exhaust system similar to the exhaust system of the aforementioned embodiments is connected to the exhaust port 431.

In the case of using these substrate processing devices, films may be formed by the sequences and processing conditions similar to those of the embodiments and modifications described above.

Hereinafter, some aspects of the present disclosure will be additionally described as supplementary notes.

(Supplementary Note 1)

According to one aspect of the present disclosure, there is provided a method for manufacturing a semiconductor device or a substrate processing method, including:

forming a metal carbide film including a first metal element and a second metal element on a substrate, by time-divisionally (non-synchronously, intermittently or pulse-wise) performing, a predetermined number of times, supplying a first precursor gas (first metal-containing gas) containing the first metal element and not containing carbon to the substrate, supplying a second precursor gas (second metal-containing gas) containing the second metal element differing from the first metal element and not containing carbon to the substrate, and supplying a reaction gas (carbon-containing gas) containing carbon to the substrate.

(Supplementary Note 2)

In the method of Supplementary Note 1, the act of forming the metal carbide film may time-divisionally perform, a predetermined number of times, forming a first film by time-divisionally performing, a predetermined number of times, the act of supplying the first precursor gas and the act of supplying the reaction gas, and forming a second film by time-divisionally performing, a predetermined number of times, the act of supplying the second precursor gas and the act of supplying the reaction gas.

(Supplementary Note 3)

In the method of Supplementary Note 2, at the act of forming the first film, the act of supplying the first precursor gas and the act of supplying the reaction gas may be alternately performed multiple times, and at the act of forming the second film, the act of supplying the second precursor gas and the act of supplying the reaction gas may be alternately performed multiple times.

(Supplementary Note 4)

In the method of Supplementary Note 2 or 3, removing (exhausting) respective gases remaining in a space in which the substrate exists may be performed after each of the act of supplying the first precursor gas, the act of supplying the reaction gas, the act of supplying the second precursor gas and the act of supplying the reaction gas.

(Supplementary Note 5)

In the method of any one of Supplementary Notes 2 to 4, a value of a work function of the metal carbide film may be controlled (adjusted, modulated or tuned) (through the control of a composition ratio) by controlling the number of performing times of the act of supplying the first precursor gas and the act of supplying the reaction gas at the act of forming the first film and the number of performing times of the act of supplying the second precursor gas and the act of supplying the reaction gas at the act of forming the second film.

(Supplementary Note 6)

In the method of any one of Supplementary Notes 2 to 5, a value of a work function of the metal carbide film may be controlled (adjusted, modulated or tuned) (through the control of a composition ratio of the metal carbide film) by controlling the number of performing times of the act of forming the first film and the number of performing times of the act of forming the second film.

(Supplementary Note 7)

In the method of any one of Supplementary Notes 1 to 6, the reaction generated in at least one of the act of supplying the first precursor gas, the act of supplying the second precursor gas and the act of supplying the reaction gas may be made unsaturated.

(Supplementary Note 8)

In the method of any one of Supplementary Notes 1 to 7, each of the first metal element and the second metal element may be one of titanium (Ti) and aluminum (Al), and the metal carbide film may be a titanium aluminum carbide film (TiAlC film).

(Supplementary Note 9)

In the method of any one of Supplementary Notes 1 to 8, the first precursor gas and the second precursor gas may be halides (metal halides).

(Supplementary Note 10)

In the method of any one of Supplementary Notes 1 to 9, the reaction gas may be a metal element-free gas. Preferably, the reaction gas may be a silicon-free and nitrogen-free gas. More preferably, the reaction gas may be a hydrocarbon-based gas.

(Supplementary Note 11)

According to another aspect of the present disclosure, there is provided a method for manufacturing a semiconductor device or a substrate processing method, including:

(a) forming a first film by time-divisionally (non-synchronously, intermittently or pulse-wise) performing, a predetermined number of times, supplying a first precursor gas (first metal-containing gas) containing a first metal element and not containing carbon to a substrate and supplying a reaction gas (carbon-containing gas) containing carbon to the substrate; and (b) forming a second film by time-divisionally (non-synchronously, intermittently or pulse-wise) performing, a predetermined number of times, supplying a second precursor gas (second metal-containing gas) containing a second metal element differing from the first metal element and not containing carbon to a substrate and supplying the reaction gas to the substrate, wherein a metal carbide film is formed on the substrate by performing the acts (a) and (b) a predetermined number of times.

(Supplementary Note 12)

In the method of Supplementary Note 11, the first metal element may be titanium (Ti), the first precursor gas may be a Ti-containing gas, the second metal element may be aluminum (Al), the second precursor gas may be an Al-containing gas, the first film may be a titanium carbide film (TiC film), the second film may be an aluminum carbide film (AlC film), and the metal carbide film may be a TiAlC film.

(Supplementary Note 13)

According to another aspect of the present disclosure, there is provided a method for manufacturing a semiconductor device or a substrate processing method, including:

forming a metal carbide film on a substrate by sequentially and time divisionally (non-synchronously, intermittently or pulse-wise) performing, a predetermined number of times, supplying a reaction gas (carbon-containing gas) containing carbon to the substrate, removing (exhausting) the reaction gas remaining in a space in which the substrate exists, supplying a first precursor gas (first metal-containing gas) containing a first metal element and not containing carbon to the substrate, removing (exhausting) the first precursor gas remaining in the space in which the substrate exists, supplying a second precursor gas (second metal-containing gas) containing a second metal element differing from the first metal element and not containing carbon to the substrate, and removing (exhausting) the second precursor gas remaining in the space in which the substrate exists.

(Supplementary Note 14)

In the method of Supplementary Note 13, at the act of supplying the first precursor gas and the act of supplying the second precursor gas, a work function of the metal carbide film may be controlled (adjusted, modulated or tuned) (through the control of a composition ratio) by controlling a supply time or a supply flow rate of each of the first precursor gas and the second precursor gas.

(Supplementary Note 15)

According to another aspect of the present disclosure, there is provided a substrate processing device, including:

a process chamber configured to accommodate a substrate;

a gas supply system configured to supply a first precursor gas (first metal-containing gas) containing a first metal element and not containing carbon, a second precursor gas (second metal-containing gas) containing a second metal element differing from the first metal element and not containing carbon, and a reaction gas (carbon-containing gas) containing carbon, to the substrate accommodated within the process chamber; and a control part configured to control the gas supply system so that a metal carbide film including the first metal element and the second metal element is formed on the substrate by time-divisionally (non-synchronously, intermittently or pulse-wise) performing, a predetermined number of times, a process of supplying the first precursor gas to the substrate accommodated within the process chamber, a process of supplying the second precursor gas to the substrate accommodated within the process chamber, and a process of supplying the reaction gas to the substrate accommodated within the process chamber.

(Supplementary Note 16)

According to another aspect of the present disclosure, there are provided a program and a computer-readable recording medium storing the program, wherein the program is configured to cause a computer to execute a procedure of forming a metal carbide film on a substrate accommodated within a process chamber, by time-divisionally (non-synchronously, intermittently or pulse-wise) performing, a predetermined number of times, a procedure of supplying a first precursor gas (first metal-containing gas) containing the first metal element and not containing carbon to the substrate accommodated within the process chamber, a procedure of supplying a second precursor gas (second metal-containing gas) containing the second metal element differing from the first metal element and not containing carbon to the substrate accommodated within the process chamber, and a procedure of supplying a reaction gas (carbon-containing gas) containing carbon to the substrate accommodated within the process chamber.

According to the present disclosure, it is possible to provide a technique capable of adjusting a work function of a metal film.

INDUSTRIAL USE OF THE PRESENT DISCLOSURE

As described above, the present disclosure can be applied to, for example, a method for manufacturing a semiconductor device, a substrate processing device configured to process a substrate such as a semiconductor wafer, a glass substrate or the like, and so forth.

What is claimed is:

1. A method for manufacturing a semiconductor device, comprising:

forming a metal carbide film including a first metal element and a second metal element on a substrate, by time-divisionally performing:

forming a first film containing the first metal element and carbon and not containing the second metal element by time-divisionally performing supplying a first precursor gas containing the first metal element and not containing carbon to the substrate to form a first metal-containing layer and supplying a reaction gas containing carbon and not containing a metal element to the first metal-containing layer; and forming a second film containing the second metal element and carbon and not containing the first metal element on the first film by time-divisionally performing supplying a second precursor gas containing the second metal element differing from the first metal element and not containing carbon to the first film to form a second metal-containing layer on the first film and supplying the reaction gas to the second metal-containing layer, wherein the first precursor gas and the second precursor gas are halides.

2. The method of claim 1, wherein at the act of forming the first film, the act of supplying the first precursor gas and the act of supplying the reaction gas are alternately performed multiple times, and at the act of forming the second film, the act of supplying the second precursor gas and the act of supplying the reaction gas are alternately performed multiple times.

3. The method of claim 1, wherein removing respective gases remaining in a space in which the substrate exists is performed after each of the act of supplying the first precursor gas, the act of supplying the reaction gas at the act of forming the first film, the act of supplying the second precursor gas and the act of supplying the reaction gas at the act of forming the second film.

4. The method of claim 1, wherein a value of a work function of the metal carbide film is adjusted by controlling the number of performing times of the act of supplying the first precursor gas and the act of supplying the reaction gas at the act of forming the first film and the number of performing times of the act of supplying the second precursor gas and the act of supplying the reaction gas at the act of forming the second film.

5. The method of claim 1, wherein a value of a work function of the metal carbide film is adjusted by controlling a ratio of the number of performing times of the act of forming the first film and the number of performing times of the act of forming the second film.

6. The method of claim 1, wherein a value of a work function of the metal carbide film is adjusted by controlling a processing condition in at least one of the act of supplying the first precursor gas, the act of supplying the second precursor gas and the act of supplying the reaction gas to make reaction unsaturated in the at least one of the acts.

7. The method of claim 1, wherein the reaction gas is a hydrocarbon-based gas.

8. The method of claim 1, wherein the reaction gas is a nitrogen-free and silicon-free gas.

9. The method of claim 1, wherein the act of supplying the reaction gas containing carbon to the first metal-containing layer makes a substitution reaction with at least a portion of the first metal-containing layer to bond the first metal element to the carbon.

10. The method of claim 1, wherein the act of supplying the reaction gas to the second metal-containing layer makes a substitution reaction with at least a portion of the second metal-containing layer to bond the second metal element to the carbon.

11. The method of claim 1, wherein the first metal element is titanium (Ti), the second metal element is aluminum (Al), and the metal carbide film is a TiAlC film.

12. The method of claim 1, wherein the reaction gas is $C_3H_6$.

13. A method for manufacturing a semiconductor device, comprising:
forming a metal carbide film including a first metal element and a second metal element on a substrate, by time-divisionally performing:
forming a first film containing the first metal element and carbon and not containing the second metal element by time-divisionally performing supplying a first precursor gas containing the first metal element and not containing carbon to the substrate to form a first metal-containing layer and supplying a reaction gas containing carbon and not containing a metal element to the first metal-containing layer; and
forming a second film containing the second metal element and carbon and not containing the first metal element on the first film by time-divisionally performing supplying a second precursor gas containing the second metal element differing from the first metal element and not containing carbon to the first film to form a second metal-containing layer on the first film and supplying the reaction gas to the second metal-containing layer,
wherein the first metal element is titanium (Ti), the second metal element is aluminum (Al), and the metal carbide film is a TiAlC film.

14. A method for manufacturing a semiconductor device, comprising:
forming a metal carbide film including a first metal element and a second metal element on a substrate, by time-divisionally performing:
forming a first film containing the first metal element and carbon and not containing the second metal element by time-divisionally performing supplying a first precursor gas containing the first metal element and not containing carbon to the substrate to form a first metal-containing layer and supplying a reaction gas containing carbon and not containing a metal element to the first metal-containing layer; and
forming a second film containing the second metal element and carbon and not containing the first metal element on the first film by time-divisionally performing supplying a second precursor gas containing the second metal element differing from the first metal element and not containing carbon to the first film to form a second metal-containing layer on the first film and supplying the reaction gas to the second metal-containing layer,
wherein the reaction gas is $C_3H_6$.

* * * * *